US012796041B2

(12) United States Patent
Chu

(10) Patent No.: US 12,796,041 B2
(45) Date of Patent: *Nov. 10, 2026

(54) HETEROSTRUCTURE FIELD EFFECT TRANSISTOR (HFET) DEVICE INCLUDING HEAT DISSIPATING THERMAL PATHWAYS

(71) Applicant: PANJIT INTERNATIONAL INC., Kaohsiung (TW)

(72) Inventor: Hung Shen Chu, Zhubei (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 883 days.

This patent is subject to a terminal disclaimer.

(21) Appl. No.: 17/961,544

(22) Filed: Oct. 6, 2022

(65) Prior Publication Data

US 2024/0120385 A1 Apr. 11, 2024

(51) Int. Cl.

*H10D 62/85* (2025.01)
*H10D 30/01* (2025.01)
*H10D 30/47* (2025.01)
*H10D 62/824* (2025.01)

(52) U.S. Cl.

CPC ....... *H10D 62/8503* (2025.01); *H10D 30/015* (2025.01); *H10D 30/475* (2025.01); *H10D 62/824* (2025.01)

(58) Field of Classification Search

CPC .. H10D 62/8503; H10D 62/824; H10D 62/10; H10D 62/124; H10D 62/815; H10D 30/015; H10D 30/475; H01L 23/367; H01L 23/13; H01L 23/31; H01L 23/373; H01L 25/07

See application file for complete search history.

(56) References Cited

U.S. PATENT DOCUMENTS

| | | | | |
|---|---|---|---|---|
| 2016/0351564 A1* | 12/2016 | Azize | ........................ | H10D 8/60 |
| 2020/0083367 A1* | 3/2020 | Kojima | ................ | H10D 64/513 |
| 2024/0105825 A1* | 3/2024 | Chu | ..................... | H10D 30/015 |

FOREIGN PATENT DOCUMENTS

WO WO-2022176051 A1 * 8/2022 .............. H10P 50/73

* cited by examiner

*Primary Examiner* — William B Partridge
*Assistant Examiner* — Chevy J Boegel

(57) ABSTRACT

A semiconductor device is provided and includes a thermal conductive substrate, a nucleation layer, a buffer layer, a field-effect transistor, and a cap layer. The thermal conductive substrate is a semiconductor wafer embedded with a plurality of via-holes filled with a thermal conductive material. The nucleation layer is disposed on the thermal conductive substrate. The buffer layer is disposed on the nucleation layer. The field-effect transistor is disposed on the buffer layer, and comprises a superlattice stack, wherein the superlattice stack comprises a first set of superlattice stacked layers and a second set of superlattice stacked layers attached thereon. The cap layer is disposed on the field-effect transistor.

20 Claims, 20 Drawing Sheets

HETEROSTRUCTURE FIELD EFFECT TRANSISTOR (HFET) DEVICE INCLUDING HEAT DISSIPATING THERMAL PATHWAYS

BACKGROUND OF THE INVENTION

1. Field of the Invention

The present invention generally relates to a semiconductor device, and in particular, to a multi-channel power high electron mobility transistor (HEMT).

2. Description of the Related Art

Recently, wide-bandgap semiconductors, such as GaN and SiC, have been used extensively due to their superior material properties over Si. Power semiconductor device includes high electron mobility transistor (HEMT) device, insulated gate bipolar transistor (IGBT) device, and metal oxide semiconductor field effect transistor (MOSFET) device. Power devices have to withstand a larger voltage and current amplitude as compared to a small-signal device, to provide high output power.

Although the use of wide-bandgap semiconductor materials in power semiconductor device increases the output power and extends the temperature tolerance, the current power semiconductor devices are regarded to have reached its limit as the requirement of the performance of the power semiconductor devices is getting higher and higher. The carrier currents generated by the current power semiconductor devices is still far below the prospect promised by the wide-bandgap semiconductor materials. In addition, the heat generated from the current power semiconductor devices are accumulated in the active region, which greatly affects the operation and lifespans of the power semiconductor devices.

In summary, the conventional power semiconductor device still has considerable problems. Hence, the present disclosure provides a semiconductor device to resolve the shortcomings of conventional technology and promote industrial practicability.

SUMMARY OF THE INVENTION

In view of the aforementioned technical problems, an objective of the present disclosure is to provide a semiconductor device, which are capable of generating larger carrier currents through the channels are closer to the (transferred-) substrate, and providing thermal paths forming in the substrate to dissipate the heat generated from the active region.

In accordance with one objective of the present disclosure, a semiconductor device is provided and includes the following:

- a thermal conductive substrate, wherein the thermal conductive substrate that is a semiconductor wafer embedded with a plurality of via-holes filled with a thermal conductive material;
- a nucleation layer disposed on the thermal conductive substrate;
- a buffer layer disposed on the nucleation layer;
- a superlattice stack disposed on the buffer layer, including a superlattice stack, wherein the superlattice stack includes a first superlattice stacked layers and a second set of superlattice stacked layers attached thereon, the first set of superlattice stacked layers configured to form a two-dimensional electron gas (2DEG) carrier transport at different depths to generate a first current channel group and a second set of superlattice stacked layers configured to form a two dimensional hole gas (2DHG) carrier transport to generate a second current channel group;
- a field-effect transistor electrically connected to the superlattice stack; and
- a cap layer disposed on the superlattice stack.

Preferably, the metallic material filling in the embedded via-holes of thermal conductive native-substrate is AuTi alloy, AuSn alloy or AuNi alloy.

Preferably, the semiconductor wafer of the native-substrate is SiC, Si, GaN, or $Al_2O_3$.

Preferably, the superlattice stack further includes: a AlN spacer layer.

Preferably, the first set of superlattice stacked layers consists of a plurality of $Al_{xi}Ga_{(1-xi)}N$/GaN superlattice layer-pairs groups, in which i is an integer representing $i^{th}$ layer and xi is a mole fraction ranging from $0.3 \le xi < 1$.

Preferably, the second set of superlattice stacked layers consists of a plurality of $In_{zk}Ga_{(1-zk)}N$/GaN superlattice layer-pairs groups, in which k is an integer representing $k^{th}$ layer and zk is a mole fraction ranging from $0.3 \le zk < 1$.

Preferably, the superlattice stack further includes a third set of superlattice stacked layers disposed between the first second superlattice stacked layers and the second set of superlattice stacked layers.

Preferably, the third set of superlattice stacked layers consists of a plurality of $Al_{yj}Ga_{(1-yj)}N$/GaN superlattice layer-pairs groups, in which j is an integer representing $j^{th}$ layer and yj is a mole fraction ranging from $0.3 \le yj < 1$.

Preferably, xi is larger than yj.

Preferably, the field-effect transistor includes a source and a drain, wherein the source, the drain, and the gate penetrate into at least a portion of the superlattice stack such that a depth of the gate is less than or equal to a thickness of the first set of superlattice stacked layers, a thickness of the second set of superlattice stacked layers, a thickness of the third set of superlattice stacked layers, or a combination thereof.

In accordance with another objective of the present disclosure, a semiconductor device is provided and includes the following:

- a thermal conductive transferred-substrate, wherein the thermal conductive transferred-substrate that is a semiconductor wafer embedded with a plurality of via-holes filled with a thermal conductive material;
- a metallic interlayer disposed on the thermal conductive transferred-substrate and is configured to adhere the thermal conductive transferred-substrate;
- a cap layer disposed on the metallic interlayer;
- a field-effect transistor disposed on the cap layer, including a superlattice stack, wherein the epitaxial layer includes a first superlattice stacked layers and a second set of superlattice stacked layers attached thereon, the first set of superlattice stacked layers configured to form a two-dimensional electron gas (2DEG) carrier transport at different depths to generate a first current channel group and a second set of superlattice stacked layers configured to form a two dimensional hole gas (2DHG) carrier transport to generate a second current channel group; and
- a buffer layer disposed on the field-effect transistor.

Preferably, the metallic material filling in the embedded via-holes of thermal conductive native-substrate is AuTi alloy, AuSn alloy or AuNi alloy.

Preferably, the semiconductor wafer of the native-substrate is SiC, Si, GaAs, GaP, or GaN.

Preferably, the metallic interlayer is AuTi alloy, AuSn alloy, or AuNi alloy.

Preferably, the first set of superlattice stacked layers consists of a plurality of $Al_{xi}Ga_{(1-xi)}N/GaN$ superlattice layer-pairs groups, in which i is an integer representing $i^{th}$ layer and xi is a mole fraction ranging from $0.3 \leq xi < 1$.

Preferably, the second set of superlattice stacked layers consists of a plurality of $In_{zk}Ga_{(1-zk)}N/GaN$ superlattice layer-pairs groups, in which k is an integer representing $k^{th}$ layer and zk is a mole fraction ranging from. $0.3 \leq zk < 1$.

Preferably, the epitaxial layer further includes a third set of superlattice stacked layers disposed between the first second superlattice stacked layers and the second set of superlattice stacked layers.

Preferably, the third set of superlattice stacked layers consists of a plurality of $Al_{yj}Ga_{(1-yj)}N/GaN$ superlattice layer-pairs groups, in which j is an integer representing $j^{th}$ layer and yj is a mole fraction ranging from $0.3 \leq yj < 1$.

Preferably, xi is larger than yj.

Preferably, the field-effect transistor includes a source and a drain, wherein the source, the drain, and the gate penetrate into at least a portion of the epitaxial layer such that a depth of the gate is less than or equal to a thickness of the first set of superlattice stacked layers, a thickness of the second set of superlattice stacked layers, a thickness of the third set of superlattice stacked layers, or a combination thereof.

In summary, the beneficial effects of the present disclosure are as follows: the semiconductor device is provided with a superlattice stack including a first superlattice stacked layers and a second set of superlattice stacked layers and/or a third set of superlattice stacked layers attached thereon. The 2DEG increases as the Al mole fractions xi and/or yj of $Al_{xi}Ga_{(1-xi)}N$ and $Al_{yj}Ga_{(1-yj)}N$ of the second set of superlattice stacked layers and/or the third set of superlattice stacked layers increases. Al mole fraction x increases as the xi and/or yj of $Al_{xi}Ga_{(1-xi)}N$ and $Al_{yj}Ga_{(1-yj)}N$ approaches the thermal conductive substrate.

Furthermore, the metallic material of the via-holes embedded in the thermal conductive substrate forms a thermal path that dissipates the heat from active region of the semiconductor device to heat sink outside of the device. The original poor thermal conductive substrate, e.g., $Al_2O_3$ (sapphire) can be removed by a laser lift-off process and replaced by a thermal conductive transferred-substrate. Thus, the original poor thermal conductive substrate, e.g., $Al_2O_3$ (sapphire) can be recycled to manufacture another semiconductor device. The metallic interlayer is disposed between the transferred substrate and the active region of the HEMT to obtaining better thermal management.

Therefore, the semiconductor device generates larger carrier currents through the channels are closer to the (transferred-) substrate, and provides thermal paths forming in the substrate to dissipate the heat generated from the active region.

BRIEF DESCRIPTION OF THE DRAWINGS

The technical features, detail structures, advantages and effects of the present disclosure will be described in more details hereinafter with reference to the accompanying drawings that show various embodiments of the invention as follows.

DETAILED DESCRIPTION OF THE PREFERRED EMBODIMENTS

Figure 1A:
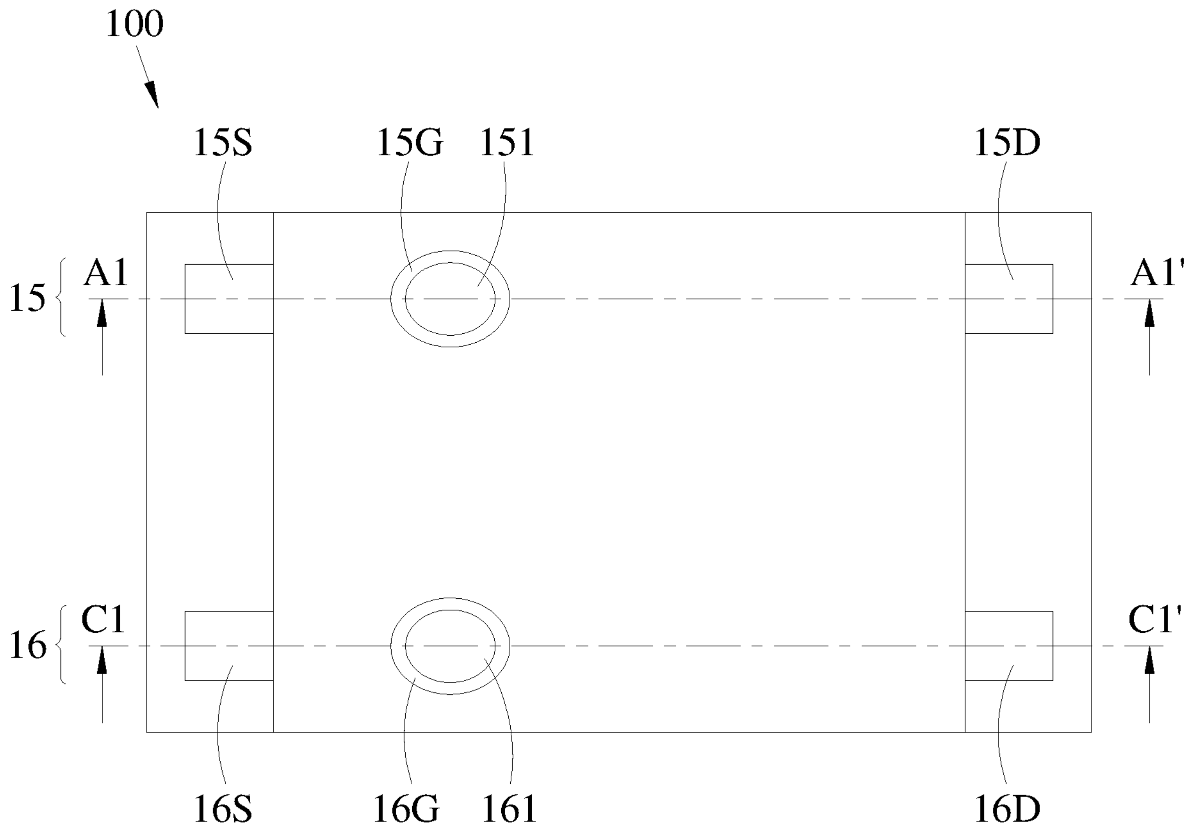
FIGS. 1A-1C are schematic diagrams of the semiconductor device in accordance with the first embodiment of the present disclosure.

In order to facilitate the understanding of the technical features, the contents and the advantages of the present disclosure, and the effectiveness thereof that can be achieved, the present disclosure will be illustrated in detail below through embodiments with reference to the accompanying drawings. The diagrams used herein are merely intended to be schematic and auxiliary to the specification, but are not necessary to be true scale and precise to the configuration after implementing the present disclosure. Thus, it should not be interpreted in accordance with the scale and the configuration of the accompanying drawings to limit the scope of the present disclosure on the practical implementation.

As those skilled in the art would realize, the described embodiments may be modified in various different ways. The exemplary embodiments of the present disclosure are for explanation and understanding only. The drawings and description are to be regarded as illustrative in nature and not restrictive. Similar reference numerals designate similar elements throughout the specification.

It is to be acknowledged that, although the terms ‘first’, ‘second’, ‘third’, and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term “or” includes any and all combinations of one or more of the associated listed items.

It will be acknowledged that when an element or layer is referred to as being “on,” “connected to” or “coupled to” another element or layer, it can be directly on, connected or coupled to the other element or layer, or intervening elements or layers may be present. In contrast, when an element is referred to as being “directly on,” “directly connected to” or “directly coupled to” another element or layer, there are no intervening elements or layers present.

Figure 1B:
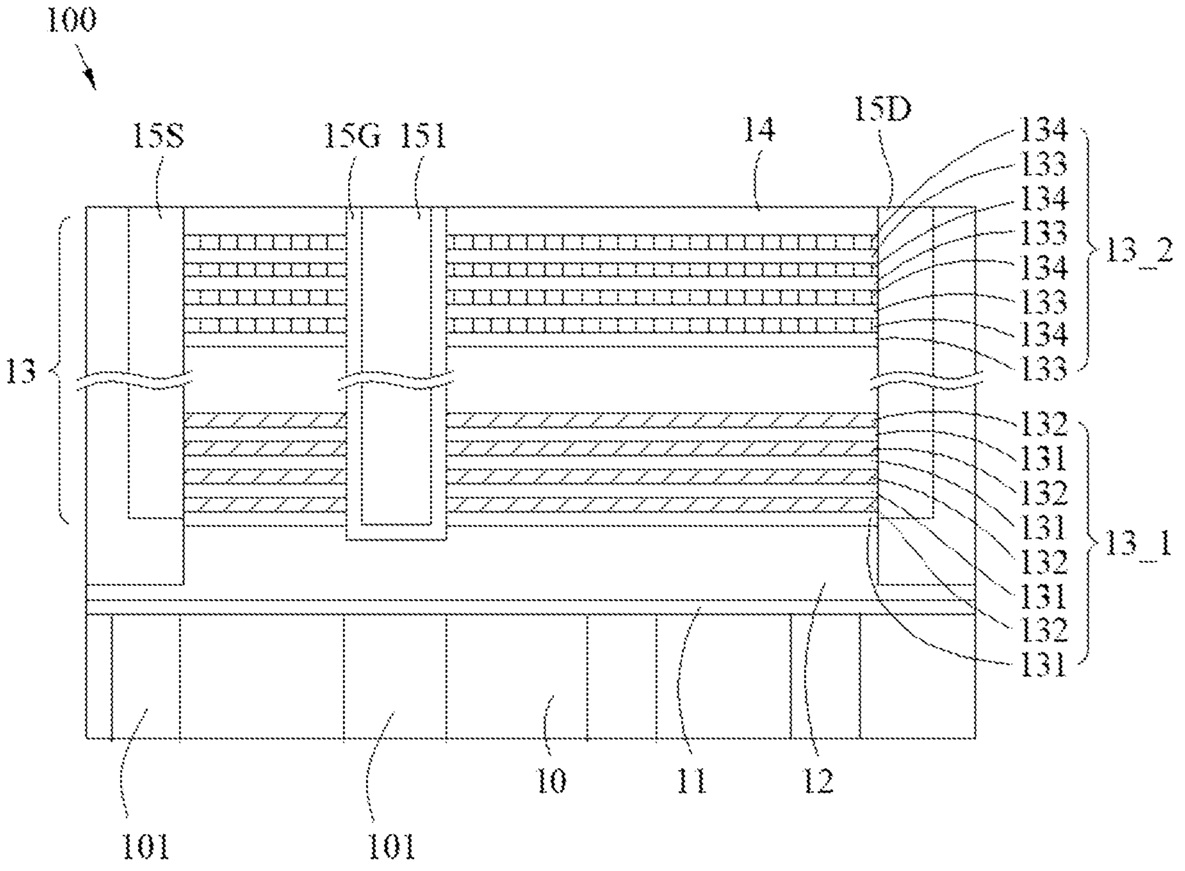
Figure 1C:
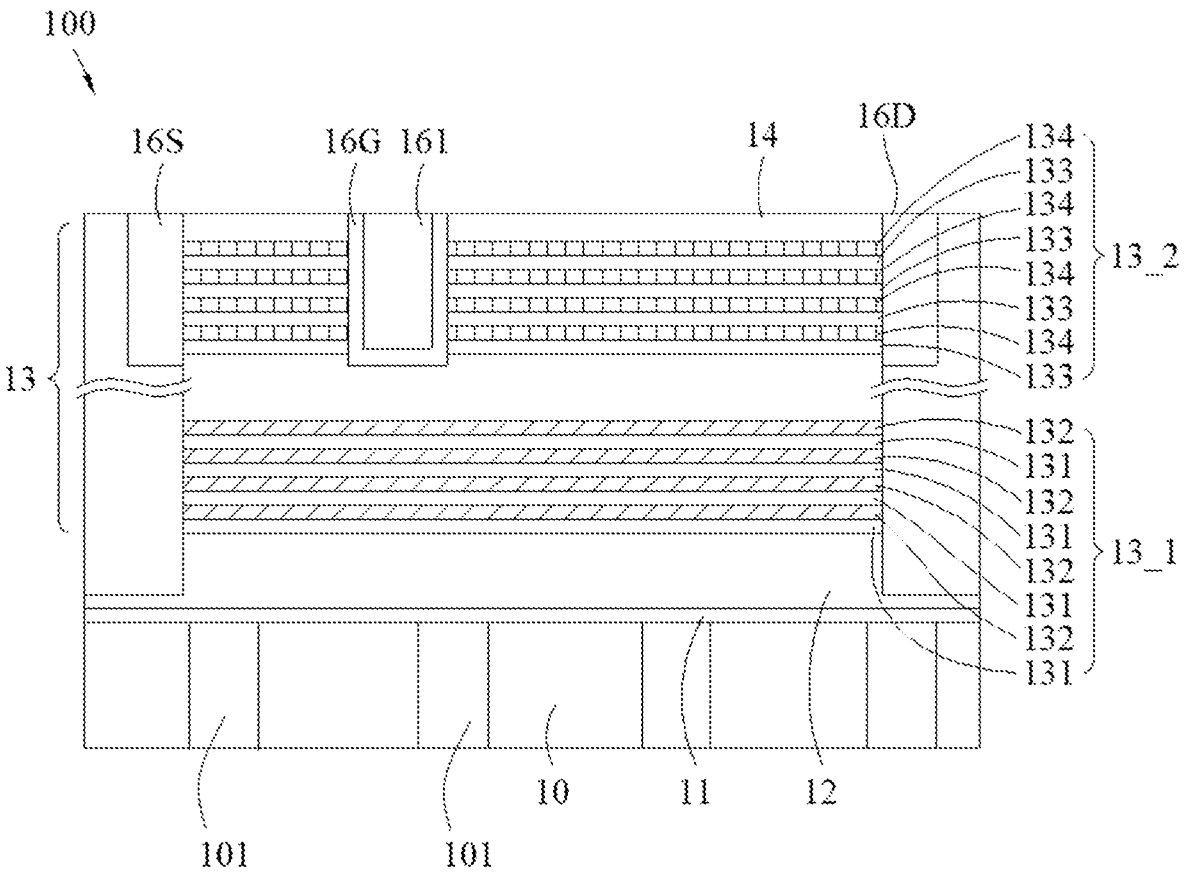

Please refer to FIGS. 1A-1C which are schematic diagrams of the semiconductor device in accordance with the first embodiment of the present disclosure. FIG. 1A shows the plan view of a semiconductor device 100. FIG. 1B shows the section view of a semiconductor device 100 along the dash line A1-A1' of the FIG. 1A. FIG. 1C shows the section view of a semiconductor device 100 along the dash line C1-C1' of the FIG. 1A.

The present disclosure provides a semiconductor device 100 which includes a thermal conductive substrate 10, a nucleation layer 11, a buffer layer 12, a superlattice stack 13, a cap layer 14, and a first field-effect transistor 15, and a second field-effect transistor 16. The nucleation layer 11, buffer layer 12, the superlattice stack 13, cap layer 14 are epitaxial layers form by epitaxial growth.

The thermal conductive substrate 10 is a semiconductor wafer embedded with a plurality of via-holes in which each is filled with a thermal conductive material 101. As shown in FIG. 1B, the via-holes and the thermal conductive material 101 can be aligned with the gate 15G of the field-effect transistor 15, thereby dissipating the heat generated from the active region. As shown in FIG. 1C, the via-holes can be spaced from each other with a fixed interval. A projected area of one of the thermal conductive material 101 can be equal to or less than a projected area of the gates 15G, 16G. The via-holes can also be formed between two adjacent gates (e.g. the first gate 15G and the second gate 16G) on the thermal conductive substrate 10. A thermal conductivity of the thermal conductive material 101 ranges between 50 to 5000 $W \cdot K^{-1} \cdot m^{-2}$, preferably 400-1000 $W \cdot K^{-1} \cdot m^{-2}$.

Examples of the thermal conductive substrate 10 includes SiC, Si, GaN or $Al_2O_3$. Examples of the thermal conductive material 101 includes iron, platinum, aluminum, gold, silver, or alloy thereof, or graphene.

The nucleation layer 11 is disposed on the thermal conductive substrate 10. A material of the nucleation layer includes GaN material. The buffer layer is disposed on the nucleation layer. A material of the buffer layer 12 includes GaN material. The superlattice stack 13 is disposed on the buffer layer 12. The cap layer 14 is disposed on the superlattice stack 13. A material of the cap layer 14 includes GaN material.

The superlattice stack 13 is formed by a multi-channel carrier transport superlattice stack (or heterojunction superlattice layers). The superlattice stack 13 includes a first superlattice stacked layers 13_1 and a second set of superlattice stacked layers 13_2. The first set of superlattice stacked layers 13_1 is disposed on the buffer layer 12 and the second set of superlattice stacked layers 13_2 is disposed on the first set of superlattice stacked layers 13_1.

The first set of superlattice stacked layers 13_1 consists of a plurality of $Al_{xi}Ga_{(1-xi)}N$/GaN superlattice layer-pairs groups. Each of the $Al_{xi}Ga_{(1-xi)}N$/GaN superlattice layer-pairs groups consists of an $Al_{xi}Ga_{(1-xi)}N$ barrier layer and a GaN channel layer 132. A thickness of each layer of the $Al_{xi}Ga_{(1-xi)}N$/GaN superlattice layer-pairs groups ranges from 20 nm to 80 nm, preferably 20 nm to 40 nm. Therefore, a thickness of the overall device can be manufactured thinner and is less than 150 μm. In the $Al_{xi}Ga_{(1-xi)}N$ barrier layer 131, i is an integer representing $i^{th}$ layer, and xi is a mole fraction ranging from 0.1≤xi<1, preferably 0.3≤xi<1. The mole fraction xi, x, or i is decreasing from the thermal conductive substrate 10 such that the Al element of $Al_{xi}Ga_{(1-xi)}N$ barrier layer 131 closest to the cap layer has the greatest mole fraction xi. For example, when x is equal to 0.3 and i is equal to 1 to 3, The first set of superlattice stacked layers 13_1 consists of an $Al_{0.31}Ga_{(1-0.31)}N$/GaN superlattice layer-pairs group, an $Al_{0.32}Ga_{(1-0.32)}N$/GaN superlattice layer-pairs group, and an $Al_{0.33}Ga_{(1-0.33)}N$/GaN superlattice layer-pairs group. Therefore, the first set of superlattice stacked layers 13_1 forms a two-dimensional electron gas (2DEG) carrier transport to generate a first current channel group.

The second set of superlattice stacked layers 13_2 consists of a plurality of $In_{zk}Ga_{(1-zk)}N$/GaN superlattice layer-pairs groups. Each of the $In_{zk}Ga_{(1-zk)}N$/GaN superlattice layer-pairs groups consists of an $In_{zk}Ga_{(1-zk)}N$ barrier layer 133 and a GaN channel layer 134. A thickness of each layer of the $In_{zk}Ga_{(1-zk)}N$/GaN superlattice layer-pairs groups ranges from 20 nm to 80 nm, preferably 20 nm to 40 nm. Therefore, a thickness of the overall device can be manufactured thinner and is less than 150 μm. In the $In_{zk}Ga_{(1-zk)}N$ barrier layer 133, k is an integer representing $k^{th}$ layer, and zk is a mole fraction ranging from 0.1≤zk<1, preferably 0.3≤zk<1. The mole fraction zk, z, or k is decreasing from the thermal conductive substrate such that the In element of $In_{zk}Ga_{(1-zk)}N$ barrier layer 133 closest to the cap layer has the greatest mole fraction zk. For example, when z is equal to 0.3 and k is equal to 1 to 10, The second set of superlattice stacked layers 13_2 consists of an $In_{0.31}Ga_{(1-0.31)}N$/GaN superlattice layer-pairs group, an $In_{0.32}Ga_{(1-0.32)}N$/GaN superlattice layer-pairs group, and an $In_{0.33}Ga_{(1-0.33)}N$/GaN superlattice layer-pairs group, and so on. The second set of superlattice stacked layers 13_2 forms a two-dimensional hole gas (2DHG) carrier transport at different depths to generate a second current channel group. The different carrier flow transport means form the multi-channel semiconductor layers.

In the present embodiment, the first set of superlattice stacked layers 13_1 only show four $Al_{xi}Ga_{(1-xi)}N$/GaN superlattice layer-pairs groups, and the second set of superlattice stacked layers 13_2 only show four $In_{zk}Ga_{(1-zk)}N$/GaN superlattice layer-pairs groups. However, the number of the $Al_{xi}Ga_{(1-xi)}N$/GaN superlattice layer-pairs groups and the $In_{zk}Ga_{(1-zk)}N$/GaN superlattice layer-pairs groups is not limited herein and may up to 100 pairs. The pair numbers are adjusted according to the power demand or the device thickness of the semiconductor device 100. For example, the device thickness of the semiconductor device 100 may be less than 20 μm. In the thickness range, the pair numbers of each superlattice layer-pairs groups may be 10~100.

The first field-effect transistor 15 and the second field-effect transistor 16 are electrically connected to the superlattice stack 13. The first gate 15G of the first field-effect transistor 15 and the second gate 16G of the second field-effect transistor 16 can be formed on a same layer (i.e. a cap layer 14).

As shown in FIG. 1B, the first field-effect transistor 15 includes a first source 15S, a first drain 15D, and a first gate 15G. The first source 15S is disposed on a side of the thermal conductive substrate 10 and penetrates into superlattice stack 13, while the first drain 15D is disposed on another side of the thermal conductive substrate 10 and penetrates into superlattice stack 13. The first gate 15G is positioned between the first source 15S and the first drain 15D. The first gate 15G is disposed within a contact via passing through the cap layer 14 and the entirety of the superlattice stack 13. That is, a first depth of the first gate 15G is less than or equal to a depth of the first set of superlattice stacked layers 13_1 and the second set of superlattice stacked layers 13_2. Therefore, the electric field generated by the first source 15S, the first drain 15D and the first gate 15G controls both the first current channel group and the second current channel group. An insulating material 151 is filled or concentrically formed in the first gate 15G. An example of the insulating material 151 includes poly-silicon (poly-Si). The first gate 15G is shaped as at least one of a circle, a semi-circle, a rectangle, a polygon, or an octagon. The insulating material 151 is disposed along a longitudinal axis of the first gate 15G.

As shown in FIG. 1C, the second field-effect transistor 16 includes a second source 16S, a second drain 16D, and a second gate 16G. An insulating material 161 is filled or concentrically formed in the second gate 16G. The second field-effect transistor 16 has the same arrangement as the first field-effect transistor 16 which is not repeated herein, except that the second gate 16G is disposed within a contact via passing through the cap layer 14 and a portion of the superlattice stack 13. That is, a second depth of the second gate 16G is less than or equal to a depth of the second set of superlattice stacked layers 13_2. Therefore, the second depth of the second gate 16G is less than the first depth of the first gate 15G. The electric field generated by the second source 16S, the second drain 16D and the second gate 16G only controls the second current channel group.

Therefore, the semiconductor device 100 can be operated by the first field-effect transistor 15, the second field-effect transistor 16, or a combination thereof. Based on the above operation means, the semiconductor device 100 can be used as a heterostructure field effect transistor with different control modes. In the present embodiment, the semiconductor device 100 is provided with two field-effect transistors, but the present disclosure is not limited on the numbers recited in the present embodiment. In other embodiment, the numbers of the field-effect transistor can be more than two and the corresponding depths of the field-effect transistor can be different.

Figure 2A:
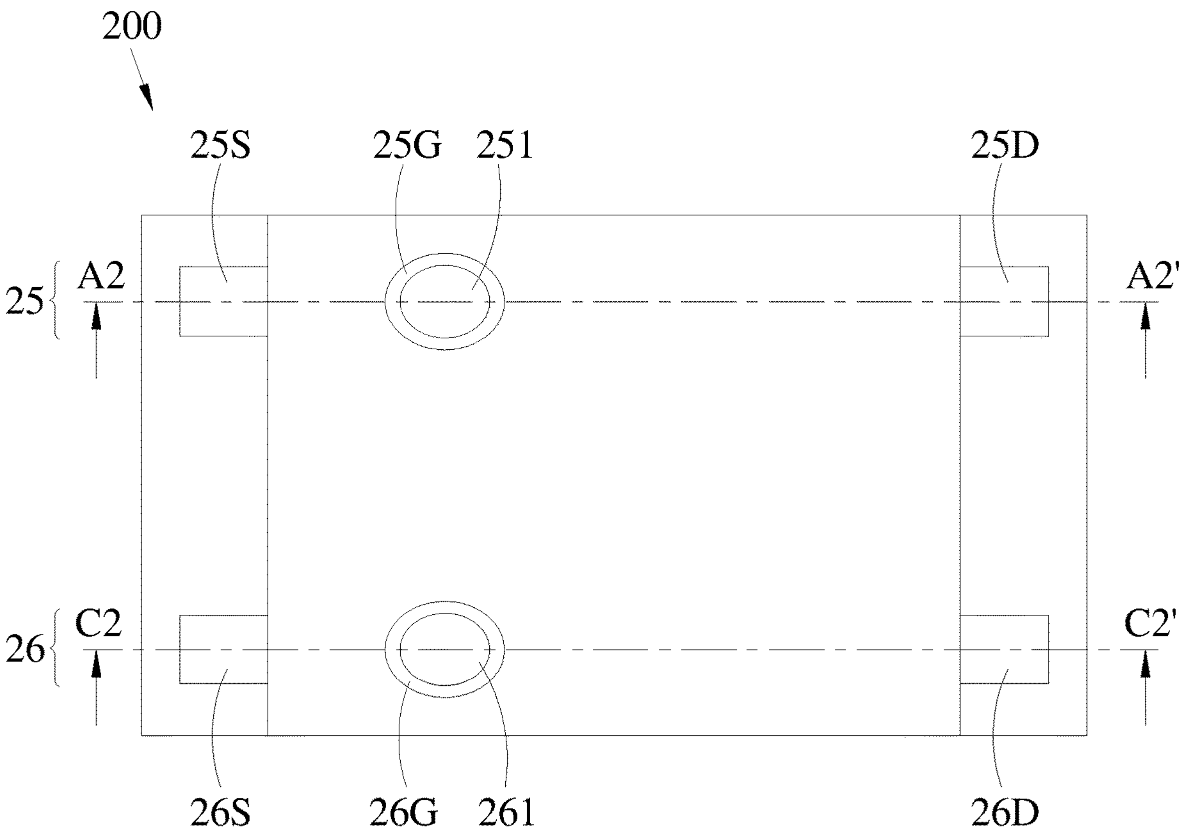
FIGS. 2A-2C are schematic diagrams of the semiconductor device in accordance with the second embodiment of the present disclosure.
Figure 2B:
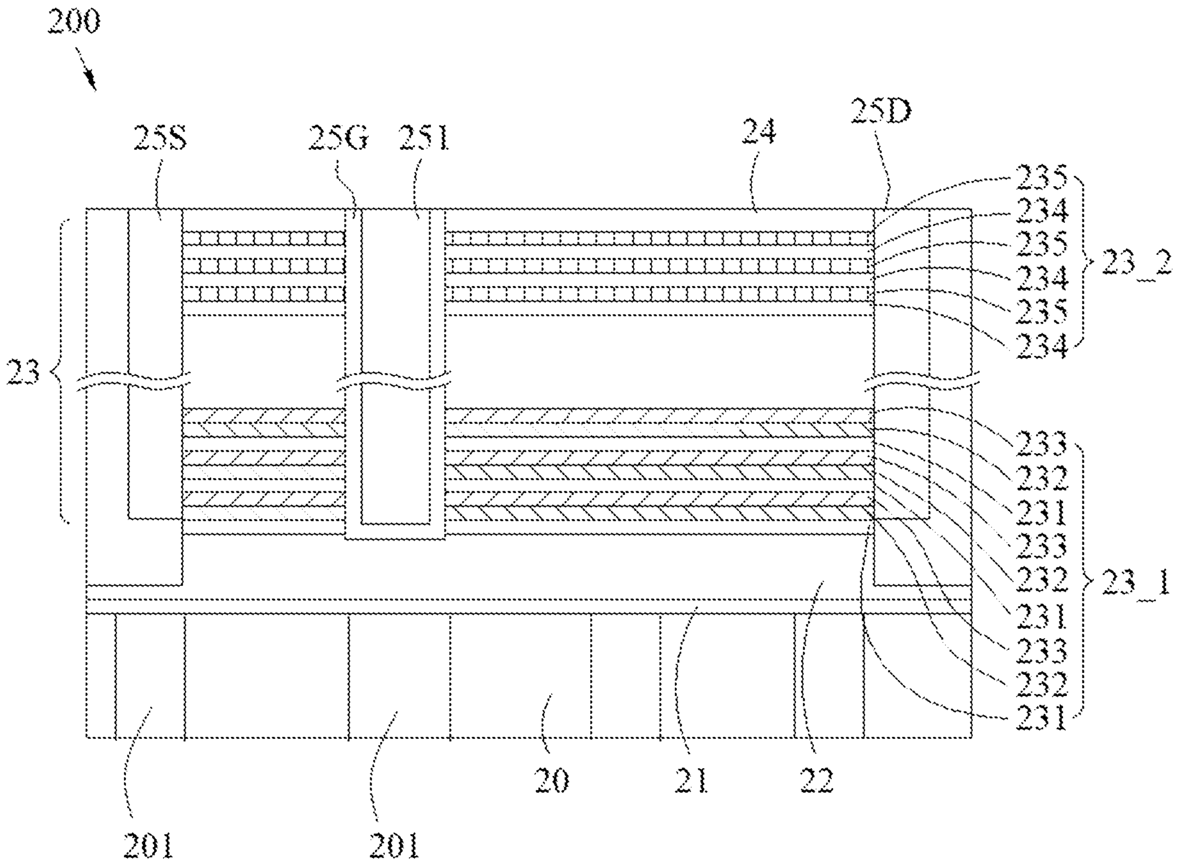
Figure 2C:
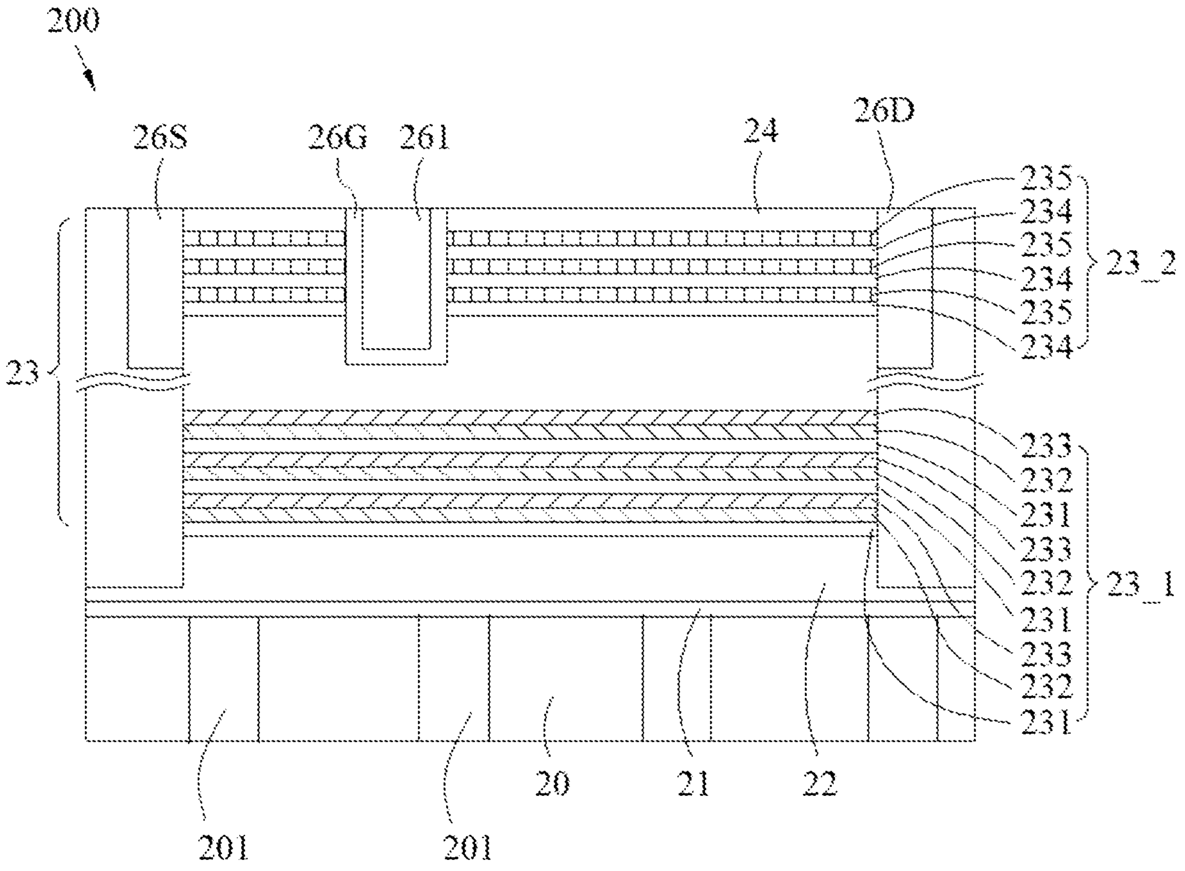

Please refer to FIGS. 2A-2C, which are schematic diagrams of the semiconductor device in accordance with the second embodiment of the present disclosure. FIG. 2A shows the plan view of a semiconductor device 200. FIG. 2B shows the section view of a semiconductor device 200 along the dash line A2-A2' of the FIG. 2A. FIG. 2C shows the section view of a semiconductor device 200 along the dash line C2-C2' of the FIG. 2A.

The semiconductor device 200 includes a thermal conductive substrate 20, a nucleation layer 21, a buffer layer 22, a superlattice stack 23, a cap layer 24, a first field-effect transistor 25 and a second field-effect transistor 26.

The thermal conductive substrate 20 is a semiconductor wafer embedded with a plurality of via-holes in which each is filled with a thermal conductive material 201. The via-holes and the thermal conductive material 201 can be aligned with the gates 25G, 26G of the field-effect transistors 25, 26, thereby dissipating the heat generated from the active region. A projected area of one of the thermal conductive material 201 can be equal to or less than a projected area of the gates 25G, 26G. The via-holes can also be formed between two adjacent gates (e.g. the first gate 25G and the second gate 26G) on the thermal conductive substrate 20. A thermal conductivity of the thermal conductive material 201 ranges between 50 to 5000 $W \cdot K^{-1} \cdot m^{-2}$, preferably 400-1000 $W \cdot K^{-1} \cdot m^{-2}$.

Examples of the thermal conductive substrate 20 includes SiC, Si, GaN or $Al_2O_3$. Examples of the thermal conductive material 201 includes iron, platinum, aluminum, gold, silver, or alloy thereof, or graphene.

The nucleation layer 21 is disposed on the thermal conductive substrate 20. A material of the nucleation layer includes GaN material. The buffer layer is disposed on the nucleation layer. A material of the buffer layer 22 includes GaN material. The superlattice stack 23 is disposed on the buffer layer 22. The cap layer 24 is disposed on the superlattice stack 23. A material of the cap layer 24 includes GaN material.

The superlattice stack 23 is formed by a multi-channel carrier transport superlattice stack (or heterojunction superlattice layers). The superlattice stack 23 includes a first superlattice stacked layers 23_1 and a second set of superlattice stacked layers 23_2. The first set of superlattice stacked layers 23_1 is disposed on the buffer layer 22 and the second set of superlattice stacked layers 23_2 is disposed on the first set of superlattice stacked layers 23_1.

The first set of superlattice stacked layers 23_1 consists of a plurality of GaN/AlN/$Al_{xi}Ga_{(1-xi)}N$ superlattice layer-pairs groups. Each of the GaN/AlN/$Al_{xi}Ga_{(1-xi)}N$ superlattice layer-pairs groups sequentially consists of a GaN channel layer 231, AlN spacer layer 232, and a $Al_{xi}Ga_{(1-xi)}N$ barrier layer 233. A thickness of one AlN spacer layer 232 ranges from 0.5 nm to 1 nm and a thickness of each layer of the GaN/AlN/$Al_{xi}Ga_{(1-xi)}N$ superlattice layer-pairs group ranges from 20 nm to 80 nm, preferably 20 nm to 40 nm. Therefore, a thickness of the overall device can be manufactured thinner and is less than 150 μm. Therefore, a thickness of one GaN/AlN/$Al_{xi}Ga_{(1-xi)}N$ superlattice layer-pairs group ranges from 20.5 nm to 81 nm, preferably 20.5 nm to 41 nm. In the $Al_{xi}Ga_{(1-xi)}N$ barrier layer 233, i is an integer representing $i^{th}$ layer, and xi is a mole fraction ranging from 0.1≤xi<1, preferably 0.3≤xi<1. The mole fraction xi, x, or i is decreasing from the thermal conductive substrate 20 such that the Al element of $Al_{xi}Ga_{(1-xi)}N$ barrier layer 233 closest to the cap layer has the greatest mole fraction xi. For example, when x is equal to 0.3 and i is equal to 1 to 3, The first set of superlattice stacked layers 23_1 consists of a GaN/AlN/$Al_{0.31}Ga_{(1-0.31)}N$ superlattice layer-pairs group, a GaN/AlN/$Al_{0.32}Ga_{(1-0.32)}N$ superlattice layer-pairs group, and a GaN/AlN/$Al_{0.33}Ga_{(1-0.33)}N$ superlattice layer-pairs group. Therefore, the first set of superlattice stacked layers 23_1 forms a two-dimensional electron gas (2DEG) carrier transport to generate a first current channel group.

The second set of superlattice stacked layers 23_2 consists of a plurality of $In_{zk}Ga_{(1-zk)}N$/GaN superlattice layer-pairs groups. Each of the $In_{zk}Ga_{(1-zk)}N$/GaN superlattice layer-pairs groups sequentially consists of an $In_{zk}Ga_{(1-zk)}N$ superlattice layer 234 and a GaN channel layer 235. A thickness of each layer of the $In_{zk}Ga_{(1-zk)}N$/GaN superlattice layer-pairs group ranges from 20 nm to 80 nm, preferably 20 nm to 40 nm. Therefore, a thickness of the overall device can be manufactured thinner and is less than 150 μm. In the $In_{zk}Ga_{(1-zk)}N$ barrier layer 234, k is an integer representing $k^{th}$ layer, and zk is a mole fraction ranging from 0.1≤zk<1, preferably 0.3≤zk<1. The mole fraction zk, z, or k is decreasing from the thermal conductive substrate 10 such that the In element of $In_{zk}Ga_{(1-zk)}N$ barrier layer 234 closest to the cap layer has the greatest mole fraction zk. For example, when z is equal to 0.3 and k is equal to 1 to 10, The second set of superlattice stacked layers 23_2 consists of an $In_{0.31}Ga_{(1-0.31)}N$/GaN superlattice layer-pairs group, an $In_{0.32}Ga_{(1-0.32)}N$/GaN superlattice layer-pairs group, and an $In_{0.33}Ga_{(1-0.33)}N$/GaN superlattice layer-pairs group, and so on. The second set of superlattice stacked layers 23_2 forms a two-dimensional hole gas (2DHG) carrier transport at different depths to generate a second current channel group. The different carrier flow transport means form the multi-channel semiconductor layers.

The AlN spacer layers 231 can increase the carrier mobility, so as to provide a high-speed semiconductor device. In addition, the AlN spacer layers 231 is a thin layer for reducing the thickness of the semiconductor device 200.

In the present embodiment, the first set of superlattice stacked layers 23_1 only show three GaN/AlN/$Al_{xi}Ga_{(1-xi)}N$ superlattice layer-pairs groups, and the second set of superlattice stacked layers 23_2 only show four $In_{zk}Ga_{(1-zk)}N$/GaN superlattice layer-pairs groups. However, the number of the $Al_{xi}Ga_{(1-xi)}N$/GaN superlattice layer-pairs groups and the $In_{zk}Ga_{(1-zk)}N$/GaN superlattice layer-pairs groups is not limited herein and may up to 100 pairs. The pair numbers are adjusted according to the power demand or the device thickness of the semiconductor device 200. For example, the device thickness of the semiconductor device 200 may be less than 20 μm. In the thickness range, the pair numbers of each superlattice layer-pairs groups may be 10~100.

The first field-effect transistor 25 and the second field-effect transistor 26 are electrically connected to the superlattice stack 23. The first gate 25G of the first field-effect transistor 25 and the second gate 26G of the second field-effect transistor 26 can be formed on a same layer (i.e. a cap layer 24).

As shown in FIG. 2B, the first field-effect transistor 25 includes a first source 25S, a first drain 25D, and a first gate 25G. The first source 25S is disposed on a side of the thermal conductive substrate 20 and penetrates into superlattice stack 23, while the first drain 25D is disposed on another side of the thermal conductive substrate 20 and penetrates into superlattice stack 23. The first gate 25G is positioned between the first source 25S and the first drain 25D. The first gate 25G is disposed within a contact via passing through the cap layer 24 and the entirety of the superlattice stack 23. That is, a first depth of the first gate 25G is less than or equal to a depth of the first set of superlattice stacked layers 23_1 and the second set of superlattice stacked layers 23_2. Therefore, the electric field generated by the first source 25S, the first drain 25D and the first gate 25G controls both the first current channel group and the second current channel group. An insulating material 251 is filled or concentrically formed in the first gate 25G. An example of the insulating material 252 includes poly-silicon (poly-Si). The first gate 25G is shaped as at least one of a circle, a semi-circle, a rectangle, a polygon, or an octagon. The insulating material 251 is disposed along a longitudinal axis of the first gate 25G.

As shown in FIG. 2C, the second field-effect transistor 26 includes a second source 26S, a second drain 26D, and a second gate 26G. An insulating material 261 is filled or concentrically formed in the second gate 26G. The second field-effect transistor 26 has the same arrangement as the first field-effect transistor 26 which is not repeated herein, except that the second gate 26G is disposed within a contact via passing through the cap layer 24 and a portion of the superlattice stack 23. That is, a second depth of the second gate 26G is less than or equal to a depth of the second set of superlattice stacked layers 23_2. Therefore, the second depth of the second gate 26G is less than the first depth of the first gate 25G. The electric field generated by the second source 26S, the second drain 26D and the second gate 26G only controls the second current channel group.

Therefore, the semiconductor device 200 can be operated by the first field-effect transistor 25, the second field-effect transistor 26, or a combination thereof. Based on the above operation means, the semiconductor device 200 can be used as a heterostructure field effect transistor with different control modes. In the present embodiment, the semiconductor device 200 is provided with two field-effect transistors, but the present disclosure is not limited on the numbers recited in the present embodiment. In other embodiment, the numbers of the field-effect transistor can be more than two and the corresponding depths of the field-effect transistor can be different.

Figure 3A:
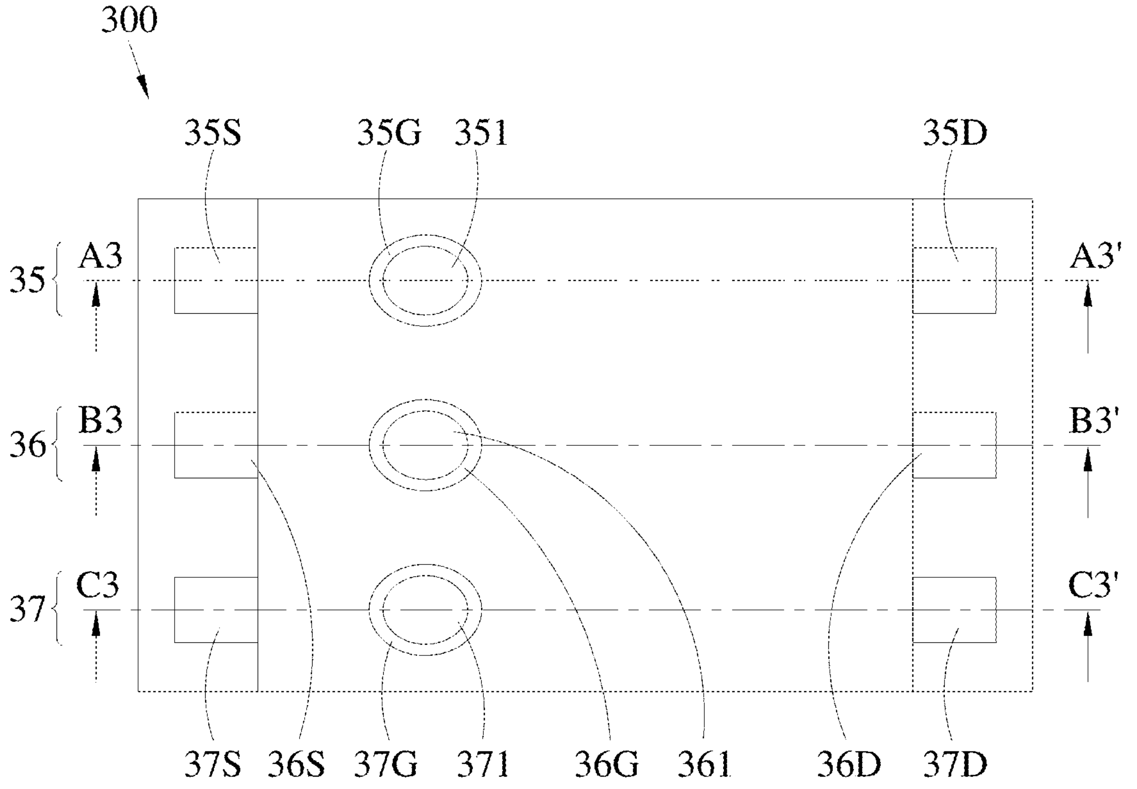
FIGS. 3A-3D are schematic diagrams of the semiconductor device in accordance with the third embodiment of the present disclosure.
Figure 3B:
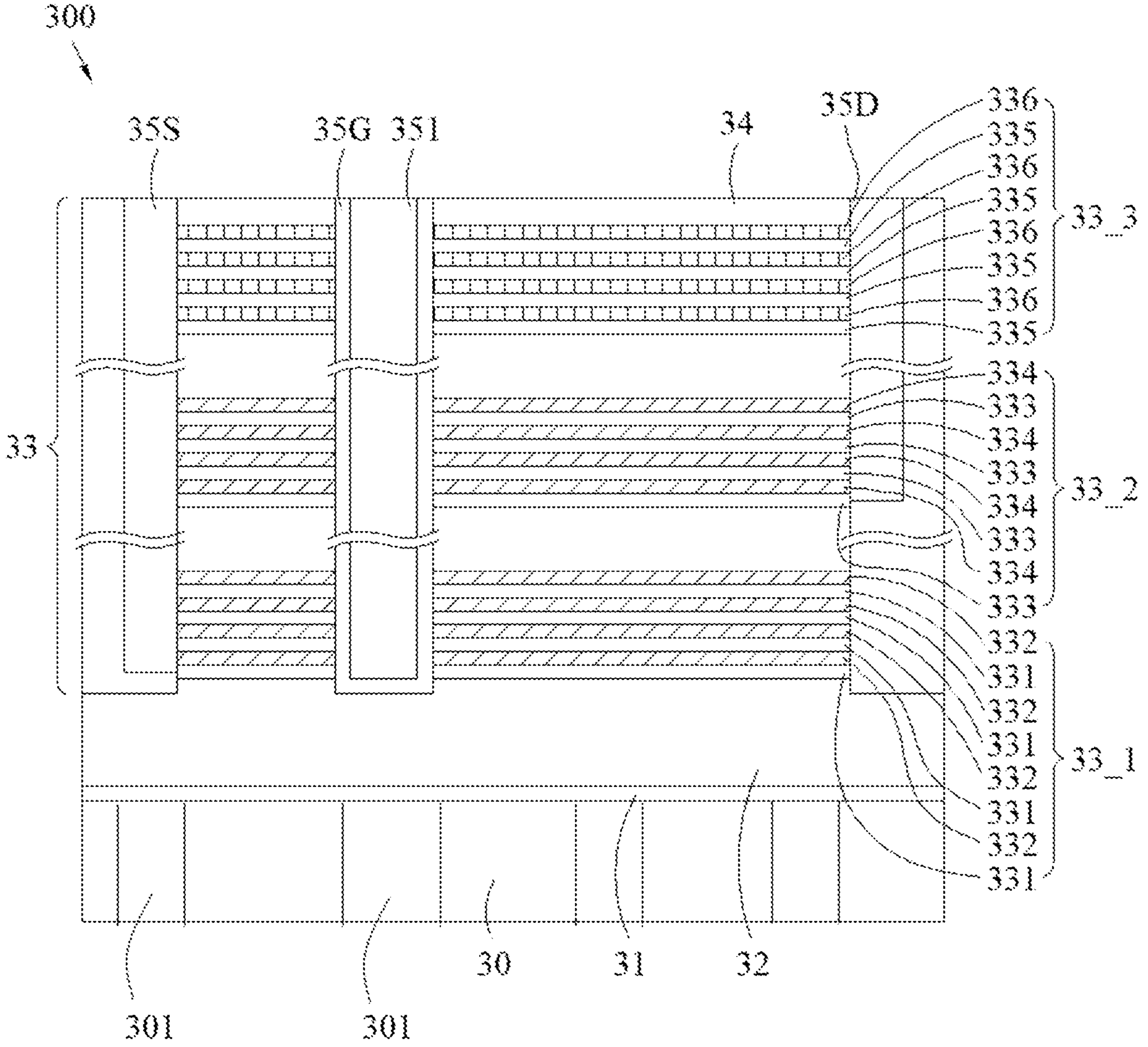
Figure 3C:
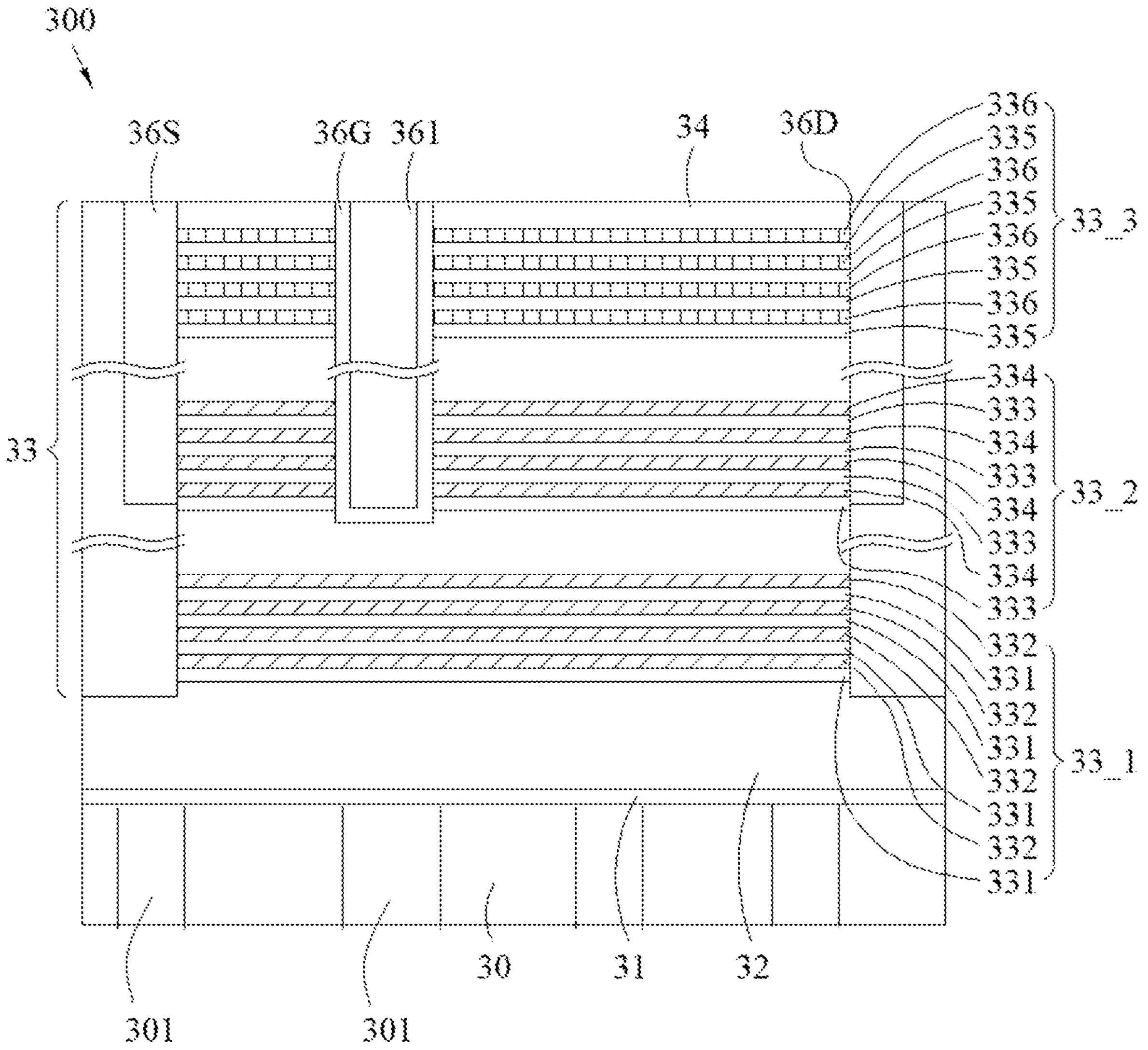
Figure 3D:
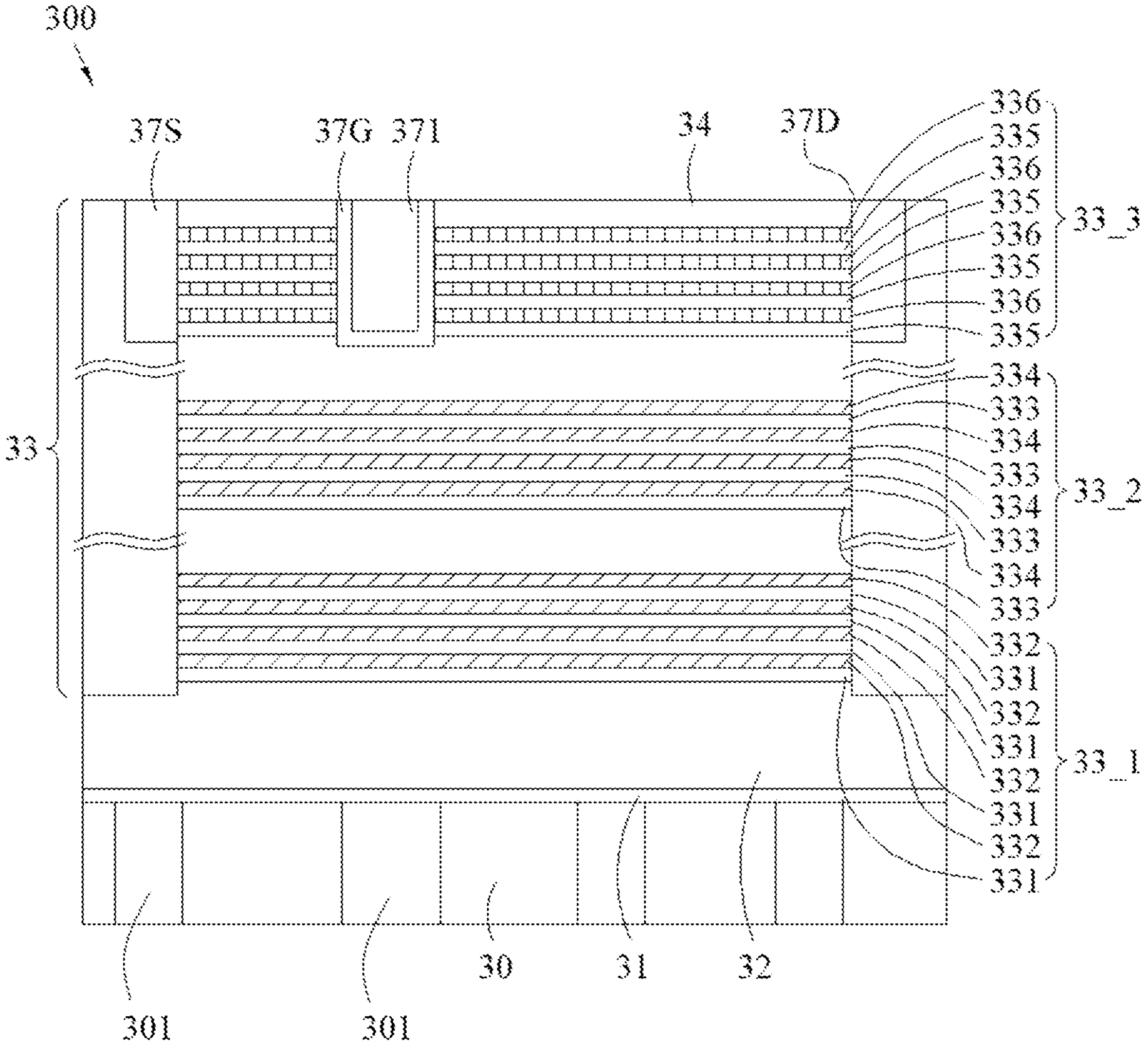

Please refer to FIGS. 3A-3D, which are schematic diagrams of the semiconductor device in accordance with the third embodiment of the present disclosure. FIG. 3A shows the plan view of a semiconductor device 300. FIG. 3B shows the section view of a semiconductor device 300 along the dash line A3-A3' of the FIG. 3A. FIG. 3C shows the section view of a semiconductor device 300 along the dash line B3-B3' of the FIG. 3A. FIG. 3D shows the section view of a semiconductor device 300 along the dash line C3-C3' of the FIG. 3A.

The semiconductor device 300 includes a thermal conductive substrate 30, a nucleation layer 31, a buffer layer 32, a superlattice stack 33, a cap layer 34, a first field-effect transistor 35, a second field-effect transistor 36, and a third field-effect transistor 37.

The thermal conductive substrate 30 is a semiconductor wafer embedded with a plurality of via-holes in which each is filled with a thermal conductive material 301. The via-holes and the thermal conductive material 301 can be aligned with the gates 35G, 36G, 37G of the field-effect transistors 35, 36, 37 thereby dissipating the heat generated from the active region. A projected area of one of the thermal conductive material 301 can be equal to or less than a projected area of the gates 35G, 36G, 37G. The via-holes can also be formed between two adjacent gates (e.g. the first gate 35G, the second gate 36G, and the third gate 37G) on the thermal conductive substrate 30. A thermal conductivity of the thermal conductive material 301 ranges between 50 to 5000 $W \cdot K^{-1} \cdot m^{-2}$, preferably 400-1000 $W \cdot K^{-1} \cdot m^{-2}$.

Examples of the thermal conductive substrate 30 includes SiC, Si, GaN or $Al_2O_3$. Examples of the thermal conductive material 301 includes iron, platinum, aluminum, gold, silver, or alloy thereof, or graphene.

The nucleation layer 31 is disposed on the thermal conductive substrate 30. A material of the nucleation layer includes GaN material. The buffer layer is disposed on the nucleation layer. A material of the buffer layer 32 includes GaN material. The superlattice stack 33 is disposed on the buffer layer 32. The cap layer 34 is disposed on the superlattice stack 33. A material of the cap layer 34 includes GaN material.

The superlattice stack 33 is formed by a multi-channel carrier transport superlattice stack (or heterojunction superlattice layers). The superlattice stack 33 includes a first superlattice stacked layers 33_1, a third set of superlattice stacked layers 33_2, a second set of superlattice stacked layers 33_3. The first set of superlattice stacked layers 33_1 is disposed on the buffer layer 32. The third set of superlattice stacked layers 33_2 is disposed on the first set of superlattice stacked layers 33_1. The second set of superlattice stacked layers 33_3 is disposed on the third set of superlattice stacked layers 33_2. Therefore, the third set of superlattice stacked layers 33_2 is disposed between the first set of superlattice stacked layers 33_1 and the second set of superlattice stacked layers 33_3.

The first set of superlattice stacked layers 33_1 consists of a plurality of $Al_{xi}Ga_{(1-xi)}N$/GaN superlattice layer-pairs groups. Each of the $Al_{xi}Ga_{(1-xi)}N$/GaN superlattice layer-pairs groups consists of an $Al_{xi}Ga_{(1-xi)}N$ barrier layer 331 and a GaN channel layer 332. A thickness of each layer of the $Al_{xi}Ga_{(1-xi)}N$/GaN superlattice layer-pairs groups ranges from 20 nm to 80 nm, preferably 20 nm to 40 nm. Therefore, a thickness of the overall device can be manufactured thinner and is less than 150 μm. In the $Al_{xi}Ga_{(1-xi)}N$ barrier layer 331, i is an integer representing $i^{th}$ layer, and xi is a mole fraction ranging from 0.1≤xi<1, preferably 0.3≤xi<1. The mole fraction xi, x, or i is decreasing from the thermal conductive substrate 10 such that the Al element of $Al_{xi}Ga_{(1-xi)}N$ barrier layer 331 closest to the cap layer 34 has the greatest mole fraction xi. For example, when x is equal to 0.3 and i is equal to 1 to 3, The first set of superlattice stacked layers 33_1 consists of an $Al_{0.31}Ga_{(1-0.31)}N$/GaN superlattice layer-pairs group, an $Al_{0.32}Ga_{(1-0.32)}N$/GaN superlattice layer-pairs group, and an $Al_{0.33}Ga_{(1-0.33)}N$/GaN superlattice layer-pairs group. Therefore, the first set of superlattice stacked layers 33_1 forms a two-dimensional electron gas (2DEG) carrier transport to generate a first current channel group.

The second set of superlattice stacked layers 33_3 consists of a plurality of $In_{zk}Ga_{(1-zk)}N$/GaN superlattice layer-pairs groups. Each of the $In_{zk}Ga_{(1-zk)}N$/GaN superlattice layer-pairs groups consists of an $In_{zk}Ga_{(1-zk)}N$ barrier layer 335 and a GaN channel layer 336. A thickness of each layer of the $In_{zk}Ga_{(1-zk)}N$/GaN superlattice layer-pairs groups ranges from 20 nm to 80 nm, preferably 20 nm to 40 nm. Therefore, a thickness of the overall device can be manufactured thinner and is less than 150 μm. In the $In_{zk}Ga_{(1-zk)}N$ barrier layer 335, k is an integer representing $k^{th}$ layer, and zk is a mole fraction ranging from 0.1≤zk<1, preferably 0.3≤zk<1. The mole fraction zk, z, or k is decreasing from the thermal conductive substrate 10 such that the In element of $In_{zk}Ga_{(1-zk)}N$ barrier layer 335 closest to the cap layer 34 has the greatest mole fraction zk. For example, when z is equal to 0.3 and k is equal to 1 to 10, The second set of superlattice stacked layers 33_3 consists of an $In_{0.31}Ga_{(1-0.31)}N$/GaN superlattice layer-pairs group, an $In_{0.32}Ga_{(1-0.32)}N$/GaN superlattice layer-pairs group, and an $In_{0.33}Ga_{(1-0.33)}N$/GaN superlattice layer-pairs group, and so on. The second set of superlattice stacked layers 33_3 forms a two-dimensional hole gas (2DHG) carrier transport at different depths to generate a second current channel group. The different carrier flow transport means form the multi-channel semiconductor layers.

The third set of superlattice stacked layers 33_2 consists of a plurality of $Al_{yj}Ga_{(1-yj)}N$/GaN superlattice layer-pairs groups. Each of the $Al_{yj}Ga_{(1-yj)}N$/GaN superlattice layer-pairs groups consists of an $Al_{yj}Ga_{(1-yj)}N$ barrier layer 333 and a GaN channel layer 334. A thickness of each layer of the $Al_{yj}Ga_{(1-yj)}N$/GaN superlattice layer-pairs groups ranges from 20 nm to 80 nm, preferably 20 nm to 40 nm. Therefore, a thickness of the overall device can be manufactured thinner and is less than 150 μm. In the $Al_{yj}Ga_{(1-yj)}N$ barrier layer 333, $j^{th}$ is an integer representing $i^{th}$ layer, and yj is a mole fraction ranging from 0.1≤yj<1, preferably 0.3≤yj<1. The mole fraction yj, y, or j is decreasing from the thermal conductive substrate 10 such that the Al element of $Al_{yj}Ga_{(1-yj)}N$ barrier layer 333 closest to the cap layer 34 has the greatest mole fraction yj. For example, when y is equal to 0.3 and j is equal to 1 to 3. The third set of superlattice stacked layers 33_2 consists of an $Al_{0.31}Ga_{(1-0.31)}N$/GaN superlattice layer-pairs group, an $Al_{0.32}Ga_{(1-0.32)}N$/GaN superlattice layer-pairs group, and an $Al_{0.33}Ga_{(1-0.33)}N$/GaN superlattice layer-pairs group. Therefore, the third set of superlattice stacked layers 33_2 forms a two-dimensional electron gas (2DEG) carrier transport to generate a third current channel group.

In the present embodiment, the first set of superlattice stacked layers 33_1 only show four $Al_{xi}Ga_{(1-xi)}N$/GaN superlattice layer-pairs groups, the second set of superlattice stacked layers 33_3 only show four $In_{zk}Ga_{(1-zk)}N$/GaN superlattice layer-pairs groups, and the third set of superlattice stacked layers 33_2 only show four $Al_{yj}Ga_{(1-yj)}N$/GaN superlattice layer-pairs groups. However, the number of the $Al_{xi}Ga_{(1-xi)}N$/GaN superlattice layer-pairs groups and the $In_{zk}Ga_{(1-zk)}N$/GaN superlattice layer-pairs groups is not limited herein and may up to 100 pairs. The pair numbers are adjusted according to the power demand or the device thickness of the semiconductor device 300. For example, the device thickness of the semiconductor device 300 may be less than 20 μm. In the thickness range, the pair numbers of each superlattice layer-pairs groups may be 10~100.

The first field-effect transistor 35, the second field-effect transistor 36, and the third field-effect transistor 36 are electrically connected to the superlattice stack 33. The first gate 35G of the first field-effect transistor 35 and the second gate 36G of the second field-effect transistor 36 can be formed on a same layer (i.e. a cap layer 34).

As shown in FIG. 3B, the first field-effect transistor 35 includes a first source 35S, a first drain 35D, and a first gate 35G. The first source 35S is disposed on a side of the thermal conductive substrate 30 and penetrates into superlattice stack 33, while the first drain 35D is disposed on another side of the thermal conductive substrate 30 and penetrates into superlattice stack 33. The first gate 35G is positioned between the first source 35S and the first drain 35D. The first gate 35G is disposed within a contact via passing through the cap layer 34 and the entirety of the superlattice stack 33. That is, a first depth of the first gate 35G is less than or equal to a depth of the first set of superlattice stacked layers 33_1, the second set of superlattice stacked layers 33_3, and the third set of superlattice stacked layers 33_2. Therefore, the electric field generated by the first source 35S, the first drain 35D and the first gate 35G controls the first current channel group, the second current channel group, and the third current channel group. An insulating material 351 is filled or concentrically formed in the first gate 35G. An example of the insulating material 351 includes poly-silicon (poly-Si). The first gate 35G is shaped as at least one of a circle, a semi-circle, a rectangle, a polygon, or an octagon. The insulating material 351 is disposed along a longitudinal axis of the first gate 35G.

As shown in FIG. 3C, the second field-effect transistor 36 includes a second source 36S, a second drain 36D, and a second gate 36G. An insulating material 361 is filled or concentrically formed in the second gate 36G. The second field-effect transistor 36 has the same arrangement as the first field-effect transistor 35 which is not repeated herein, except that the second gate 36G is disposed within a contact via passing through the cap layer 34 and a portion of the superlattice stack 33. That is, a second depth of the second gate 36G is less than or equal to a depth of the second set of superlattice stacked layers 33_3 and the third set of superlattice stacked layers 33_2. Therefore, the second depth of the second gate 36G is less than the first depth of the first gate 35G. The electric field generated by the second source 36S, the second drain 36D and the second gate 36G only controls the second current channel group and the third current channel group.

The third field-effect transistor 37 includes a third source 37S, a third drain 37D, and a third gate 37G. An insulating material 371 is filled or concentrically formed in the third gate 37G. The third field-effect transistor 37 has the same arrangement as the first field-effect transistor 35 which is not repeated herein, except that the third gate 37G is disposed within a contact via passing through the cap layer 34 and a portion of the superlattice stack 33. That is, a third depth of the third gate 37G is less than or equal to a depth of the second set of superlattice stacked layers 33_3. Therefore, the third depth of the third gate 37G is less than the first depth of the first gate 35G. The electric field generated by the third source 37S, the third drain 37D and the third gate 37G only controls the third current channel group.

Therefore, the semiconductor device 300 can be operated by the first field-effect transistor 35, the second field-effect transistor 36, the third field-effect transistor 37, or a combination thereof. Based on the above operation means, the semiconductor device 300 can be used as a heterostructure field effect transistor with different control modes. In the present embodiment, the semiconductor device 300 is provided with three field-effect transistors, but the present disclosure is not limited on the numbers recited in the present embodiment. In other embodiment, the numbers of the field-effect transistor can be more than two and the corresponding depths of the field-effect transistor can be different.

Figure 4A:
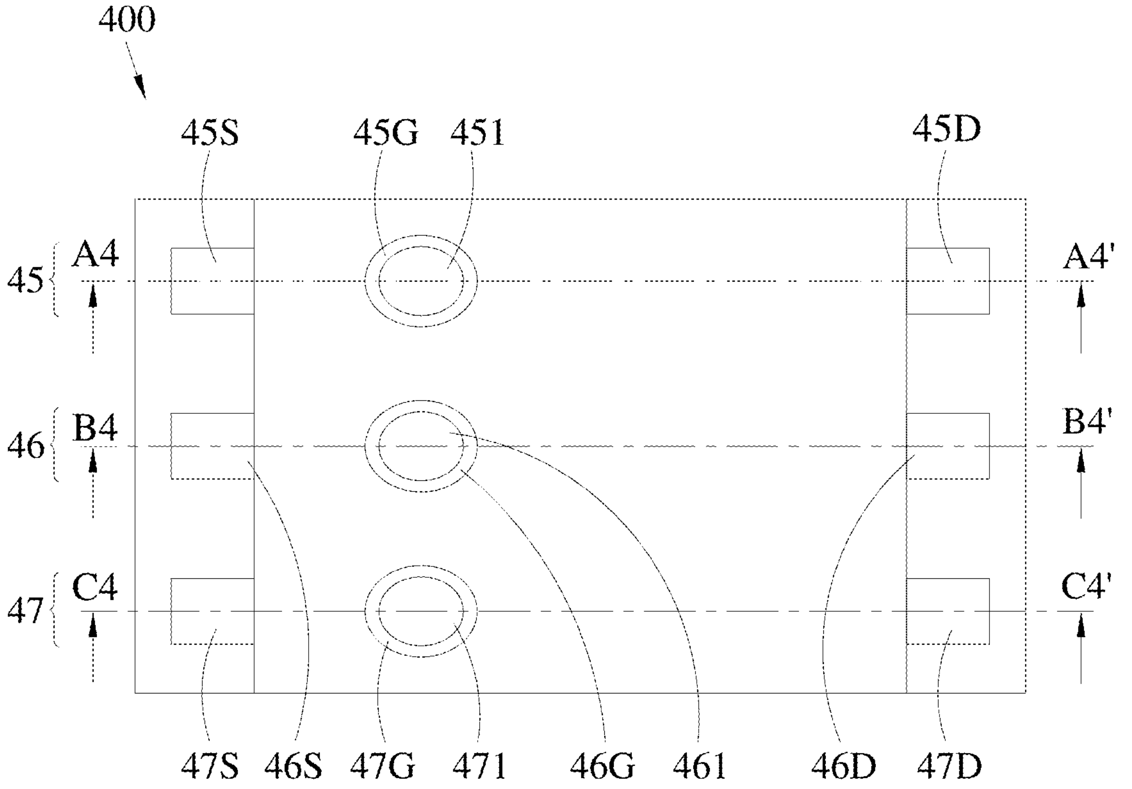
FIGS. 4A-4D are schematic diagrams of the semiconductor device in accordance with the fourth embodiment of the present disclosure.
Figure 4B:
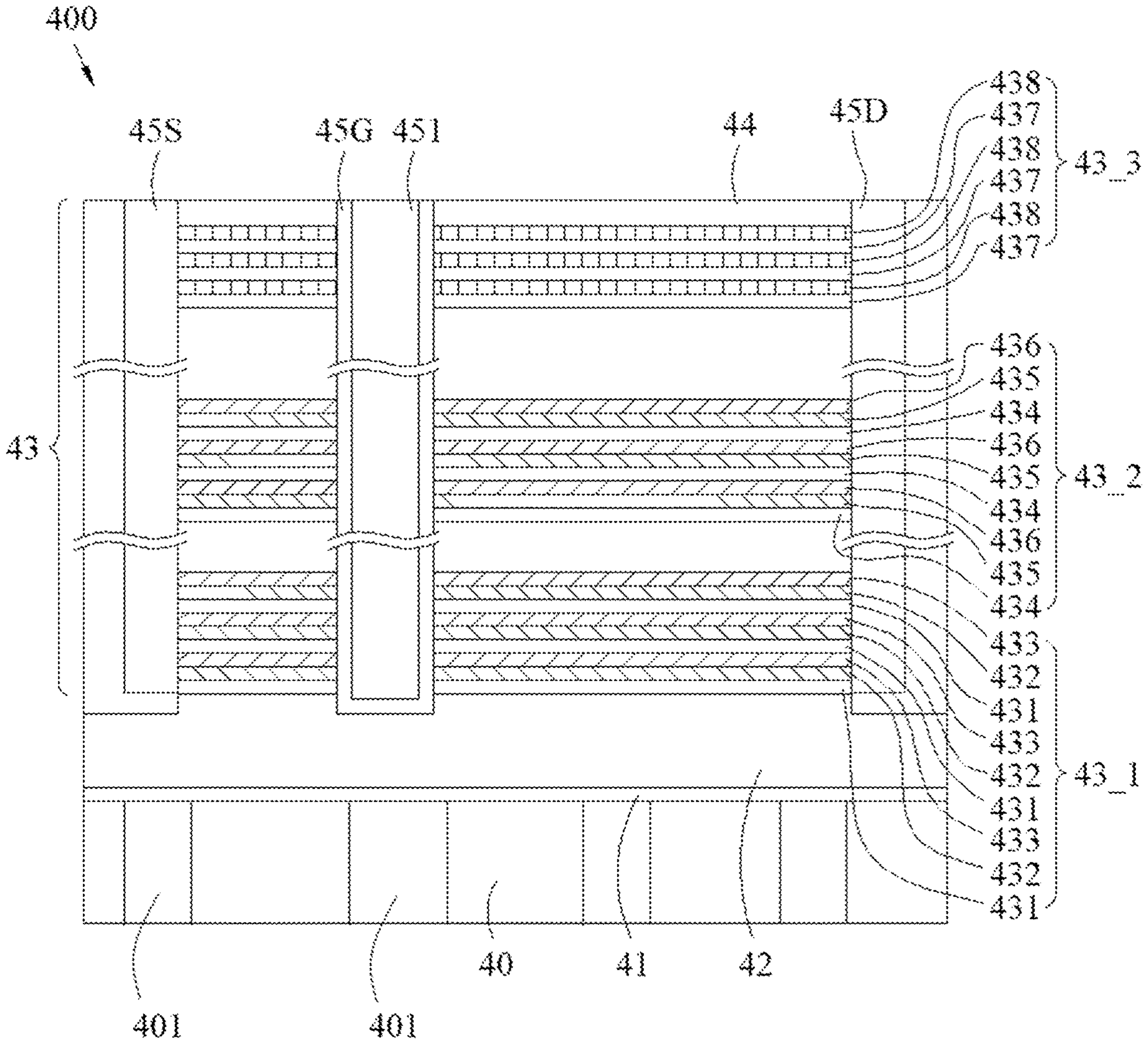
Figure 4C:
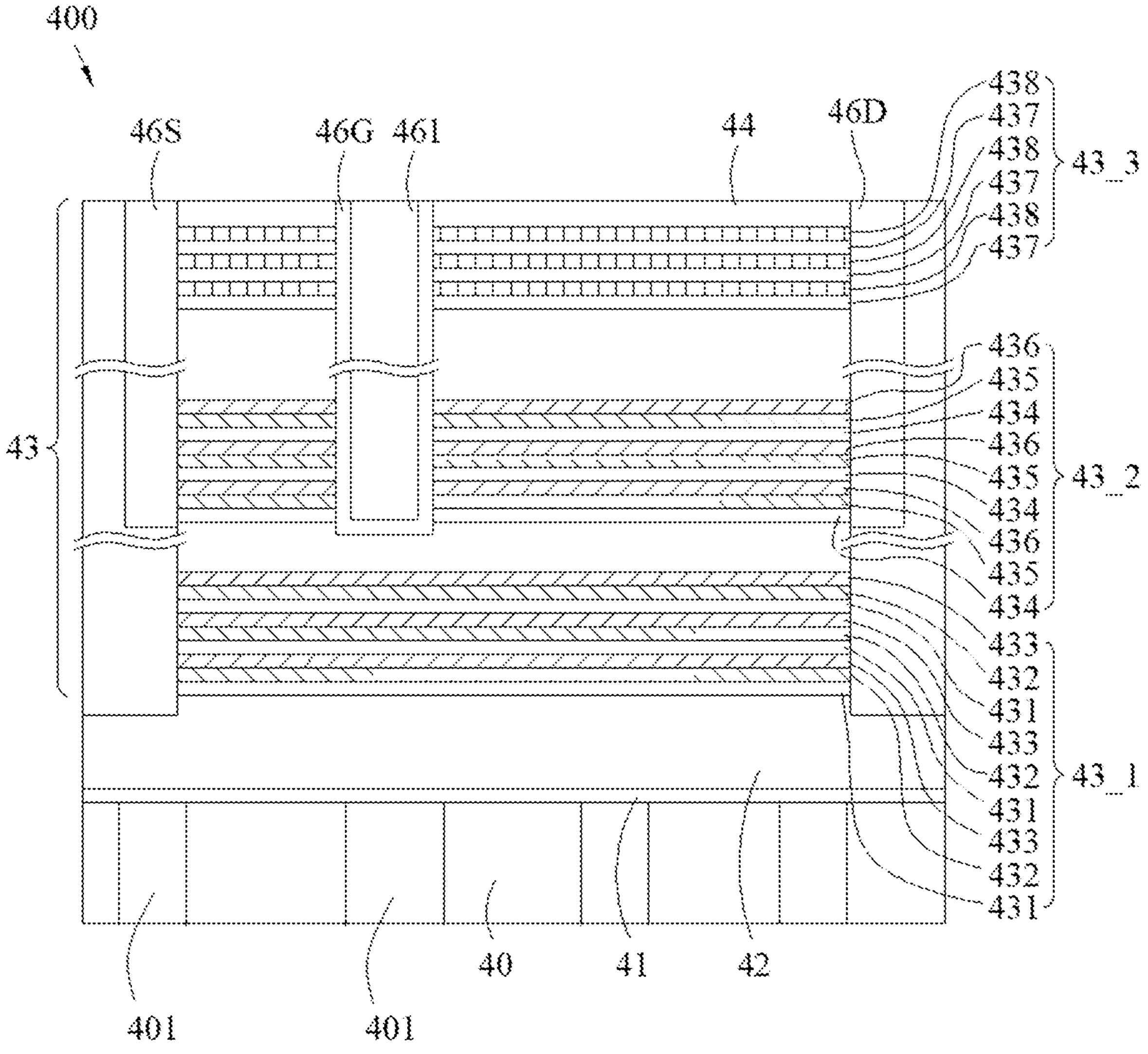
Figure 4D:
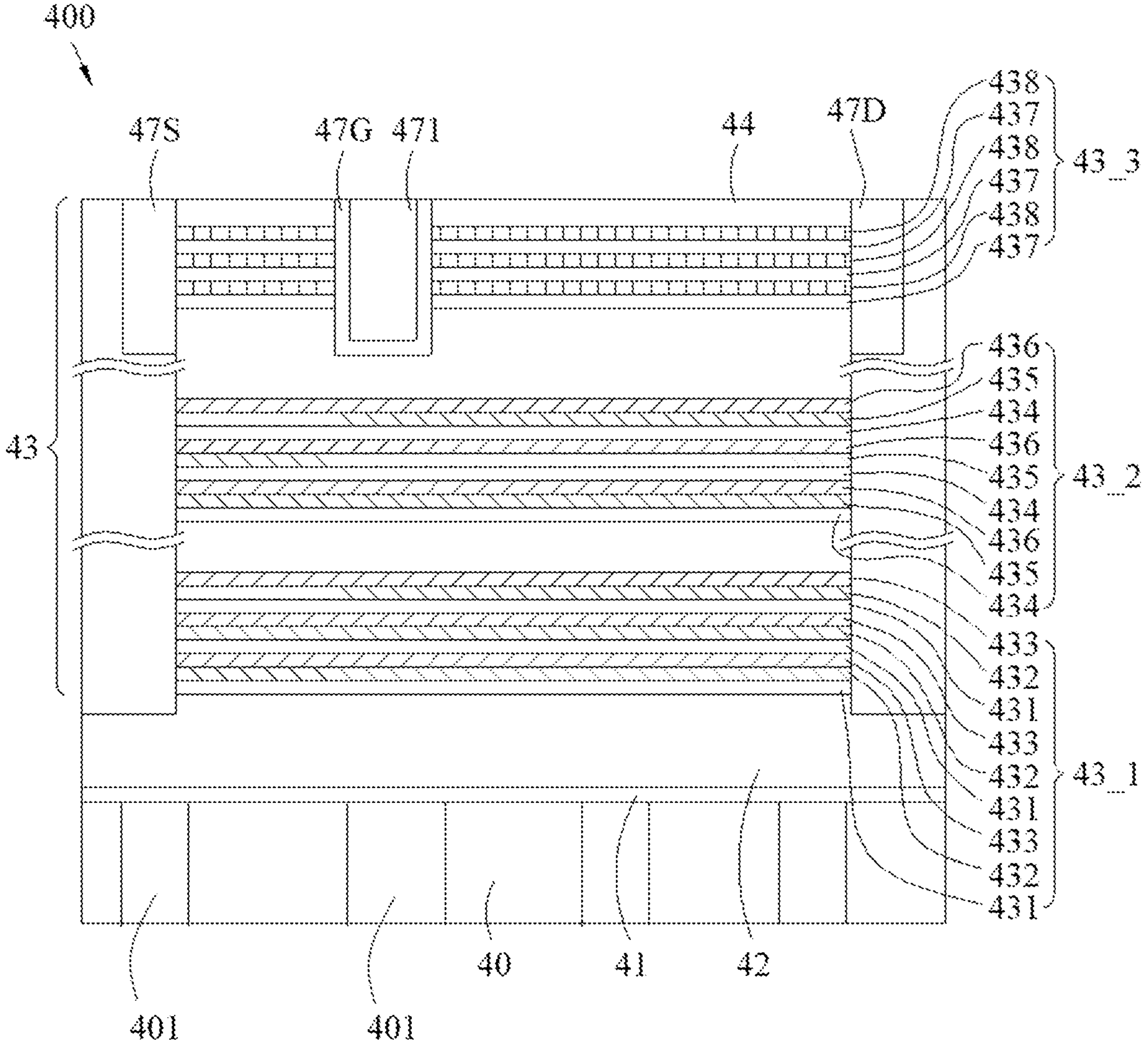

Please refer to FIGS. 4A-4D, which are schematic diagrams of the semiconductor device in accordance with the fourth embodiment of the present disclosure. FIG. 4A shows the plan view of a semiconductor device 400. FIG. 4B shows the section view of a semiconductor device 400 along the dash line A4-A4' of the FIG. 4A. FIG. 4C shows the section view of a semiconductor device 400 along the dash line B4-B4' of the FIG. 4A. FIG. 4D shows the section view of a semiconductor device 400 along the dash line C4-C4' of the FIG. 4A.

The semiconductor device 400 includes a thermal conductive substrate 40, a nucleation layer 41, a buffer layer 42, a superlattice stack 43, a cap layer 44, a first field-effect transistor 45 a second field-effect transistor 46, and a third field-effect transistor 47.

The thermal conductive substrate 40 is a semiconductor wafer embedded with a plurality of via-holes in which each is filled with a thermal conductive material 401. The via-holes and the thermal conductive material 401 can be aligned with the gates 45G, 46G of the field-effect transistors 45, 46, thereby dissipating the heat generated from the active region. A projected area of one of the thermal conductive material 401 can be equal to or less than a projected area of the gates 45G, 46G. The via-holes can also be formed between two adjacent gates (e.g. the first gate 45G and the second gate 46G) on the thermal conductive substrate 40. A thermal conductivity of the thermal conductive material 401 ranges between 50 to 5000 $W\cdot K^{-1}\cdot m^{-2}$, preferably 400-1000 $W\cdot K^{-1}\cdot m^{-2}$.

Examples of the thermal conductive substrate 40 includes SiC, Si, GaN or $Al_2O_3$. Examples of the thermal conductive material 401 includes iron, platinum, aluminum, gold, silver, or alloy thereof, or graphene.

The nucleation layer 41 is disposed on the thermal conductive substrate 40. A material of the nucleation layer includes GaN material. The buffer layer is disposed on the nucleation layer. A material of the buffer layer 42 includes GaN material. The superlattice stack 43 is disposed on the buffer layer 42. The cap layer 44 is disposed on the superlattice stack 43. A material of the cap layer 44 includes GaN material.

The superlattice stack 43 is formed by a multi-channel carrier transport superlattice stack (or heterojunction superlattice layers). The superlattice stack 43 includes a first set of superlattice stacked layers 43_1 and a second set of superlattice stacked layers 43_2. The first set of superlattice stacked layers 43_1 is disposed on the buffer layer 42 and the second set of superlattice stacked layers 43_2 is disposed on the first set of superlattice stacked layers 43_1.

The first set of superlattice stacked layers 43_1 consists of a plurality of $GaN/AlN/Al_{xi}Ga_{(1-xi)}N$ superlattice layer-pairs groups. Each of the $GaN/AlN/Al_{xi}Ga_{(1-xi)}N$ superlattice layer-pairs groups sequentially consists of a GaN channel layer 431, an AlN spacer layer 432, and an $Al_{xi}Ga_{(1-xi)}N$ barrier layer 433. A thickness of one AlN spacer layer 432 ranges from 0.5 nm to 1 nm and a thickness of each layer of the a $GaN/AlN/Al_{xi}Ga_{(1-xi)}N$ superlattice layer-pairs group ranges from 20 nm to 80 nm, preferably 20 nm to 40 nm. Therefore, a thickness of the overall device can be manufactured thinner and is less than 100 μm, preferably less than 80 μm, preferably ranges from 200 nm to 80 μm. Therefore, a thickness of one $GaN/AlN/Al_{xi}Ga_{(1-xi)}N$ superlattice layer-pairs group ranges from 20.5 nm to 81 nm, preferably 20.5 nm to 41 nm. In the $Al_{xi}Ga_{(1-xi)}N$ barrier layer 433, i is an integer representing $i^{th}$ layer, and xi is a mole fraction ranging from 0.1≤xi<1, preferably 0.3≤xi<1. The mole fraction xi, x, or i is decreasing from the thermal conductive substrate 40 such that the Al element of $Al_{xi}Ga_{(1-xi)}N$ barrier layer 433 closest to the cap layer has the greatest mole fraction xi. For example, when x is equal to 0.3 and i is equal to 1 to 3, The first set of superlattice stacked layers 43_1 consists of a $GaN/AlN/Al_{0.31}Ga_{(1-0.31)}N$ superlattice layer-pairs group, a $GaN/AlN/Al_{0.32}Ga_{(1-0.32)}N$ superlattice layer-pairs group, and a $GaN/AlN/Al_{0.33}Ga_{(1-0.33)}N$ superlattice layer-pairs group. Therefore, the first set of superlattice stacked layers 43_1 forms a two-dimensional electron gas (2DEG) carrier transport to generate a first current channel group.

The third set of superlattice stacked layers 43_2 consists of a plurality of $GaN/AlN/Al_{yj}Ga_{(1-yj)}N$ superlattice layer-pairs groups. Each of the $GaN/AlN/Al_{yj}Ga_{(1-yj)}N$ superlattice layer-pairs groups sequentially consists of a GaN channel layer 434, an AlN spacer layer 435, and an $Al_{yj}Ga_{(1-yj)}N$ barrier layer 436. A thickness of one AlN spacer layer 435 ranges from 0.5 nm to 1 nm and a thickness of each layer of the $GaN/AlN/Al_{yj}Ga_{(1-yj)}N$ superlattice layer-pairs group ranges from 20 nm to 80 nm, preferably 20 nm to 40 nm. Therefore, a thickness of the overall device can be manufactured thinner and is less than 150 μm. Therefore, a thickness of one $GaN/AlN/Al_{yj}Ga_{(1-yj)}N$ superlattice layer-pairs group ranges from 20.5 nm to 81 nm, preferably 20.5 nm to 41 nm. In the $Al_{yj}Ga_{(1-yj)}N$ barrier layer 436, j is an integer representing $j^{th}$ layer, and yj is a mole fraction ranging from 0.1≤yj<1, preferably 0.3≤yj<1. The mole fraction yj, y, or j is decreasing from the thermal conductive substrate 40 such that the Al element of $Al_{yj}Ga_{(1-yj)}N$ barrier layer 436 closest to the cap layer has the greatest mole fraction yj. For example, when y is equal to 0.3 and j is equal to 1 to 3, The third set of superlattice stacked layers 43_2 consists of a $GaN/AlN/Al_{0.31}Ga_{(1-0.31)}N$ superlattice layer-pairs group, a $GaN/AlN/Al_{0.32}Ga_{(1-0.32)}N$ superlattice layer-pairs group, and a $GaN/AlN/Al_{0.33}Ga_{(1-0.33)}N$ superlattice layer-pairs group. Therefore, the third set of superlattice stacked layers 43_2 forms a two-dimensional electron gas (2DEG) carrier transport to generate a third current channel group.

The second set of superlattice stacked layers 43_3 consists of a plurality of $In_{zk}Ga_{(1-zk)}N/GaN$ superlattice layer-pairs groups. Each of the $In_{zk}Ga_{(1-zk)}N/GaN$ superlattice layer-pairs groups sequentially consists of an $In_{zk}Ga_{(1-zk)}N$ barrier layer 437, and a GaN channel layer 438. A thickness of each layer of the $In_{zk}Ga_{(1-zk)}N/GaN$ superlattice layer-pairs group ranges from 20 nm to 80 nm, preferably 20 nm to 40 nm. Therefore, a thickness of the overall device can be manufactured thinner and is less than 150 μm. In the $In_{zk}Ga_{(1-zk)}N$ barrier layer 437, k is an integer representing $k^{th}$ layer, and zk is a mole fraction ranging from 0.1≤zk<1, preferably 0.3≤zk<1. The mole fraction zk, z, or k is decreasing from the thermal conductive substrate 10 such that the In element of $In_{zk}Ga_{(1-zk)}N$ barrier layer 437 closest to the cap layer has the greatest mole fraction zk. For example, when z is equal to 0.3 and k is equal to 1 to 10, The second set of superlattice stacked layers 43_3 consists of an $In_{0.31}Ga_{(1-0.31)}N$/GaN superlattice layer-pairs group, an $In_{0.32}Ga_{(1-0.32)}N$/GaN superlattice layer-pairs group, and an $In_{0.33}Ga_{(1-0.33)}N$/GaN superlattice layer-pairs group, and so on. The second set of superlattice stacked layers 43_3 forms a two-dimensional hole gas (2DHG) carrier transport at different depths to generate a second current channel group. The different carrier flow transport means form the multi-channel semiconductor layers.

The AlN spacer layers 432, 435 can increase the carrier mobility, so as to provide a high-speed semiconductor device. In addition, each of the AlN spacer layers 432, 435 is a thin layer for reducing the thickness of the semiconductor device 400.

In the present embodiment, the first set of superlattice stacked layers 43_1 only show three GaN/AlN/$Al_{xi}Ga_{(1-xi)}N$, the second set of superlattice stacked layers 43_3 only show three GaN/AlN/$Al_{yj}Ga_{(1-yj)}N$ superlattice layer-pairs groups, and the third set of superlattice stacked layers 43_2 only show three $In_{zk}Ga_{(1-zk)}N$/GaN superlattice layer-pairs groups. However, the number of the $Al_{yj}Ga_{(1-yj)}N$/GaN superlattice layer-pairs groups and the $In_{zk}Ga_{(1-zk)}N$/GaN superlattice layer-pairs groups is not limited herein and may up to 100 pairs. The pair numbers are adjusted according to the power demand or the device thickness of the semiconductor device 400. For example, the device thickness of the semiconductor device 400 may be less than 20 μm. In the thickness range, the pair numbers of each superlattice layer-pairs groups may be 10~100.

The first field-effect transistor 45, the second field-effect transistor 46, and the third field-effect transistor 46 are electrically connected to the superlattice stack 43. The first gate 45G of the first field-effect transistor 45 and the second gate 46G of the second field-effect transistor 46 can be formed on a same layer (i.e. a cap layer 44).

As shown in FIG. 4B, the first field-effect transistor 45 includes a first source 45S, a first drain 45D, and a first gate 45G. The first source 45S is disposed on a side of the thermal conductive substrate 40 and penetrates into superlattice stack 43, while the first drain 45D is disposed on another side of the thermal conductive substrate 40 and penetrates into superlattice stack 43. The first gate 45G is positioned between the first source 45S and the first drain 45D. The first gate 45G is disposed within a contact via passing through the cap layer 44 and the entirety of the superlattice stack 43. That is, a first depth of the first gate 45G is less than or equal to a depth of the first set of superlattice stacked layers 43_1, the second set of superlattice stacked layers 43_3, and the third set of superlattice stacked layers 43_2. Therefore, the electric field generated by the first source 45S, the first drain 45D and the first gate 45G controls the first current channel group, the second current channel group, and the third current channel group. An insulating material 451 is filled or concentrically formed in the first gate 45G. An example of the insulating material 452 includes poly-silicon (poly-Si). The first gate 45G is shaped as at least one of a circle, a semi-circle, a rectangle, a polygon, or an octagon. The insulating material 451 is disposed along a longitudinal axis of the first gate 45G.

As shown in FIG. 4C, the second field-effect transistor 46 includes a second source 46S, a second drain 46D, and a second gate 46G. An insulating material 461 is filled or concentrically formed in the second gate 46G. The second field-effect transistor 46 has the same arrangement as the first field-effect transistor 45 which is not repeated herein, except that the second gate 46G is disposed within a contact via passing through the cap layer 44 and a portion of the superlattice stack 43. That is, a second depth of the second gate 46G is less than or equal to a depth of the second set of superlattice stacked layers 43_3 and the third set of superlattice stacked layers 43_2. Therefore, the second depth of the second gate 46G is less than the first depth of the first gate 45G. The electric field generated by the second source 46S, the second drain 46D and the second gate 46G only controls the second current channel group and the third current channel group.

As shown in FIG. 4D, the third field-effect transistor 47 includes a third source 47S, a third drain 47D, and a third gate 47G. An insulating material 471 is filled or concentrically formed in the third gate 47G. The third field-effect transistor 47 has the same arrangement as the first field-effect transistor 45 which is not repeated herein, except that the third gate 47G is disposed within a contact via passing through the cap layer 44 and a portion of the superlattice stack 43. That is, a third depth of the third gate 47G is less than or equal to a depth of the second set of superlattice stacked layers 43_3. Therefore, the third depth of the third gate 47G is less than the first depth of the first gate 45G. The electric field generated by the third source 47S, the third drain 47D and the third gate 47G only controls the third current channel group.

Therefore, the semiconductor device 400 can be operated by the first field-effect transistor 45, the second field-effect transistor 46, the third field-effect transistor 47, or a combination thereof. Based on the above operation means, the semiconductor device 400 can be used as a heterostructure field effect transistor with different control modes. In the present embodiment, the semiconductor device 400 is provided with three field-effect transistors, but the present disclosure is not limited on the numbers recited in the present embodiment. In other embodiment, the numbers of the field-effect transistor can be more than two and the corresponding depths of the field-effect transistor can be different.

Figure 5A:
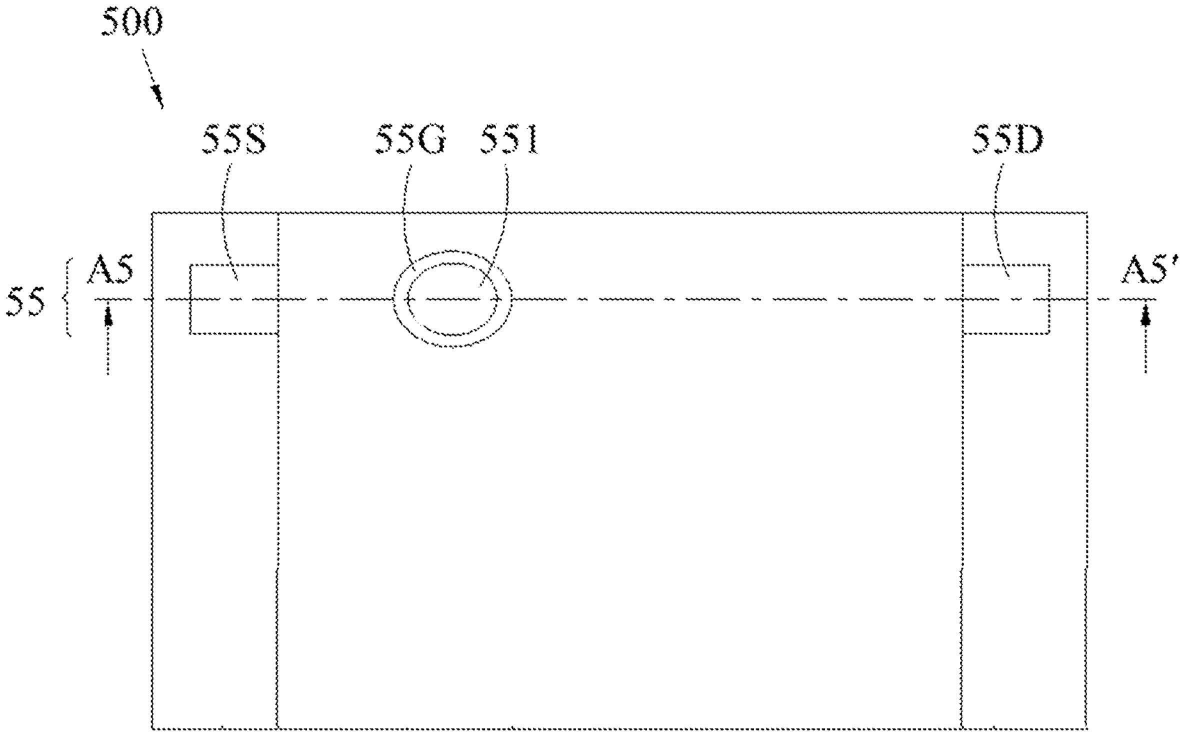
FIGS. 5A-5B are schematic diagrams of the semiconductor device in accordance with the fifth embodiment of the present disclosure.
Figure 5B:
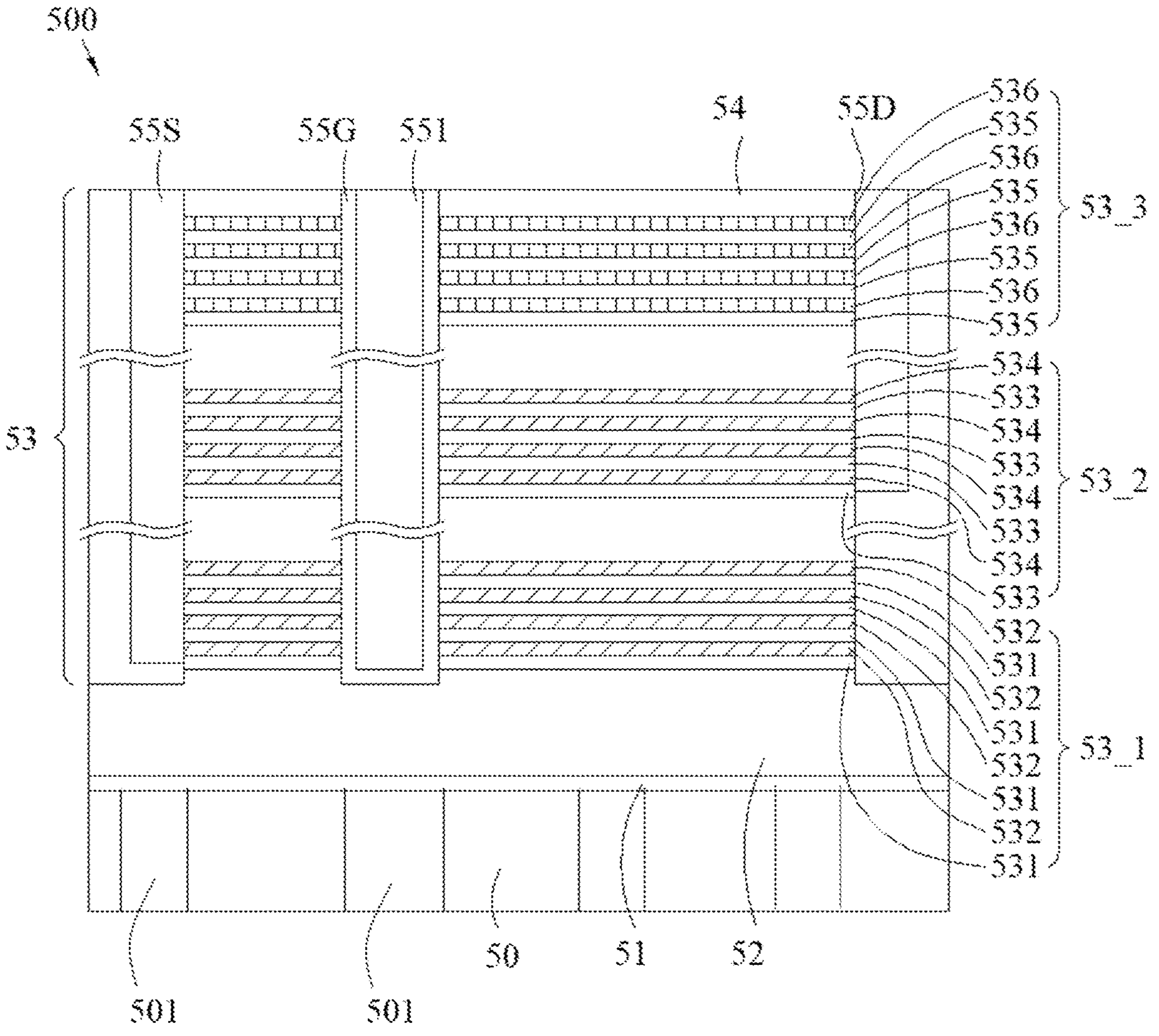

Please refer to FIGS. 5A-5B which are schematic diagrams of the semiconductor device in accordance with the fifth embodiment of the present disclosure. FIG. 5A shows the plan view of a semiconductor device 500. FIG. 5B shows the section view of a semiconductor device 500 along the dash line A5-A5' of the FIG. 5A.

The semiconductor device 500 includes a thermal conductive transferred-substrate 50, a metallic interlayer 51, a cap layer 52, a superlattice stack 53, a buffer layer 54, and a first field-effect transistor 55.

The thermal conductive transferred-substrate 50 is a semiconductor wafer embedded with a plurality of via-holes in which each is filled with a thermal conductive material 501. The via-holes and the thermal conductive material 501 can be aligned with the gate 55G of the field-effect transistor 55 thereby dissipating the heat generated from the active region. A projected area of one of the thermal conductive material 501 can be equal to or less than a projected area of the gate 55G. A thermal conductivity of the thermal conductive material 501 ranges between 50 to 5000 $W \cdot K^{-1} \cdot m^{-2}$, preferably 400-1000 $W \cdot K^{-1} \cdot m^{-2}$.

Examples of the thermal conductive transferred-substrate 50 includes SiC, Si, GaN or $Al_2O_3$. Examples of the thermal conductive material 501 includes iron, platinum, aluminum, gold, silver, or alloy thereof, or graphene.

The metallic interlayer 51 is disposed on the thermal conductive transferred-substrate 50 and is used for adhering the thermal conductive transferred-substrate 50 to the cap layer 52. A material of the metallic interlayer includes GaN material. The buffer layer is disposed on the metallic interlayer. A material of the cap layer 52 includes AuTi alloy, AuSn alloy, or AuNi alloy. Therefore, the superlattice stack 53 can be formed on a native sapphire substrate and then the native sapphire substrate is removed from the superlattice stack 53 by a laser lift-off process known in the art. The superlattice stack 53 can be transferred to the thermal conductive transferred-substrate 50 and the native sapphire substrate can be recycled and reused to generate another superlattice stack 53, thereby decreasing the manufacture cost.

The superlattice stack 53 is disposed on the cap layer 52. The buffer layer 54 is disposed on the superlattice stack 53. A material of the buffer layer 54 includes GaN material.

The superlattice stack 53 is formed by a multi-channel carrier transport superlattice stack (or heterojunction superlattice layers). The superlattice stack 53 includes a first set of superlattice stacked layers 53_1, a second set of superlattice stacked layers 53_3, a third set of superlattice stacked layers 53_2. The first set of superlattice stacked layers 53_1 is disposed on the buffer layer 52. The third set of superlattice stacked layers 53_2 is disposed on the first set of superlattice stacked layers 53_1. The second set of superlattice stacked layers 53_3 is disposed on the third set of superlattice stacked layers 53_3. Therefore, the third set of superlattice stacked layers 53_2 is disposed between the first set of superlattice stacked layers 53_1 and the second set of superlattice stacked layers 53_3.

The first set of superlattice stacked layers 53_1 consists of a plurality of $Al_{xi}Ga_{(1-xi)}N/GaN$ superlattice layer-pairs groups. Each of the $Al_{xi}Ga_{(1-xi)}N/GaN$ superlattice layer-pairs groups consists of an $Al_{xi}Ga_{(1-xi)}N$ barrier layer 531 and a GaN channel layer 532. A thickness of each layer of the $Al_{xi}Ga_{(1-xi)}N/GaN$ superlattice layer-pairs groups ranges from 20 nm to 80 nm, preferably 20 nm to 40 nm. Therefore, a thickness of the overall device can be manufactured thinner and is less than 150 μm. In the $Al_{xi}Ga_{(1-xi)}N$ barrier layer 531, i is an integer representing $i^{th}$ layer, and xi is a mole fraction ranging from 0.1≤xi<1, preferably 0.3≤xi<1. The mole fraction xi, x, or i is decreasing from the thermal conductive transferred-substrate 10 such that the Al element of $Al_{xi}Ga_{(1-xi)}N$ barrier layer 531 closest to the cap layer has the greatest mole fraction xi. For example, when x is equal to 0.3 and i is equal to 1 to 3, The first set of superlattice stacked layers 53_1 consists of an $Al_{0.31}Ga_{(1-0.31)}N/GaN$ superlattice layer-pairs group, an $Al_{0.32}Ga_{(1-0.32)}N/GaN$ superlattice layer-pairs group, and an $Al_{0.33}Ga_{(1-0.33)}N/GaN$ superlattice layer-pairs group. Therefore, the first set of superlattice stacked layers 53_1 forms a two-dimensional electron gas (2DEG) carrier transport to generate a first current channel group.

The second set of superlattice stacked layers 53_3 consists of a plurality of $In_{zk}Ga_{(1-zk)}N/GaN$ superlattice layer-pairs groups. Each of the $In_{zk}Ga_{(1-zk)}N/GaN$ superlattice layer-pairs groups consists of an $In_{zk}Ga_{(1-zk)}N$ barrier layer 533 and a GaN channel layer 534. A thickness of each layer of the $In_{zk}Ga_{(1-zk)}N/GaN$ superlattice layer-pairs groups ranges from 20 nm to 80 nm, preferably 20 nm to 40 nm. Therefore, a thickness of the overall device can be manufactured thinner and is less than 150 μm. In the $In_{zk}Ga_{(1-zk)}N$ barrier layer 533, k is an integer representing $k^{th}$ layer, and zk is a mole fraction ranging from 0.1≤zk<1, preferably 0.3≤zk<1. The mole fraction zk, z, or k is decreasing from the thermal conductive transferred-substrate 10 such that the In element of $In_{zk}Ga_{(1-zk)}N$ barrier layer 533 closest to the cap layer has the greatest mole fraction zk. For example, when z is equal to 0.3 and k is equal to 1 to 10, The second set of superlattice stacked layers 53_3 consists of an $In_{0.31}Ga_{(1-0.31)}N/GaN$ superlattice layer-pairs group, an $In_{0.32}Ga_{(1-0.32)}N/GaN$ superlattice layer-pairs group, and an $In_{0.33}Ga_{(1-0.33)}N/GaN$ superlattice layer-pairs group, and so on. The second set of superlattice stacked layers 53_2 forms a two-dimensional hole gas (2DHG) carrier transport at different depths to generate a second current channel group. The different carrier flow transport means form the multi-channel semiconductor layers.

The third set of superlattice stacked layers 53_2 consists of a plurality of $Al_{yj}Ga_{(1-yj)}N/GaN$ superlattice layer-pairs groups. Each of the $Al_{yj}Ga_{(1-yj)}N/GaN$ superlattice layer-pairs groups consists of an $Al_{yj}Ga_{(1-yj)}N$ barrier layer 535 and a GaN channel layer 536. A thickness of each layer of the $Al_{yj}Ga_{(1-yj)}N/GaN$ superlattice layer-pairs groups ranges from 20 nm to 80 nm, preferably 20 nm to 40 nm. Therefore, a thickness of the overall device can be manufactured thinner and is less than 150 μm. In the $Al_{yj}Ga_{(1-yj)}N$ barrier layer 535, j is an integer representing $j^{th}$ layer, and yj is a mole fraction ranging from 0.1≤yj<1, preferably 0.3≤yj<1. The mole fraction yj, y, or j is decreasing from the thermal conductive transferred-substrate 10 such that the Al element of $Al_{yj}Ga_{(1-yj)}N$ barrier layer 535 closest to the cap layer has the greatest mole fraction yj. For example, when y is equal to 0.3 and i is equal to 1 to 3. The third set of superlattice stacked layers 53_2 consists of an $Al_{0.31}Ga_{(1-0.31)}N/GaN$ superlattice layer-pairs group, an $Al_{0.32}Ga_{(1-0.32)}N/GaN$ superlattice layer-pairs group, and an $Al_{0.33}Ga_{(1-0.33)}N/GaN$ superlattice layer-pairs group. Therefore, the third set of superlattice stacked layers 53_2 forms a two-dimensional electron gas (2DEG) carrier transport to generate a third current channel group.

In the present embodiment, the first set of superlattice stacked layers 53_1 only show four $Al_{xi}Ga_{(1-xi)}N/GaN$ superlattice layer-pairs groups, the second set of superlattice stacked layers 53_3 only show four $In_{zk}Ga_{(1-zk)}N/GaN$ superlattice layer-pairs groups, and the third set of superlattice stacked layers 53_2 only show four $Al_{yj}Ga_{(1-yj)}N/GaN$ superlattice layer-pairs groups. However, the number of the superlattice layer-pairs groups is not limited herein and may be up to 100 pairs. The pair numbers are adjusted according to the power demand or the device thickness of the semiconductor device 500. For example, the device thickness of the semiconductor device 500 may be less than 20 μm. In the thickness range, the pair numbers of each superlattice layer-pairs groups may be 10~100.

The first field-effect transistor 55 is electrically connected to the superlattice stack 53. The first field-effect transistor 55 includes a first source 55S, a first drain 55D, and a first gate 55G. The first source 55S is disposed on a side of the thermal conductive transferred-substrate 50 and penetrates into superlattice stack 53, while the first drain 55D is disposed on another side of the thermal conductive transferred-substrate 50 and penetrates into superlattice stack 53. The first gate 55G is positioned between the first source 55S and the first drain 55D. The first gate 55G is disposed within a contact via passing through the buffer layer 54 and the entirety of the superlattice stack 53. That is, a first depth of the first gate 55G is less than or equal to a depth of the first set of superlattice stacked layers 53_1, the second set of superlattice stacked layers 53_3, and the third set of superlattice stacked layers 53_2. Therefore, the electric field generated by the first source 55S, the first drain 55D and the first gate 55G controls the first current channel group, the second current channel group, and the third current channel group. An insulating material 551 is filled or concentrically formed in the first gate 55G. An example of the insulating material 552 includes poly-silicon (poly-Si). The first gate 55G is shaped as at least one of a circle, a semi-circle, a rectangle, a polygon, or an octagon. The insulating material 551 is disposed along a longitudinal axis of the first gate 55G.

In the present embodiment, the semiconductor device 500 is provided with three superlattice stacked layers, but the present disclosure is not limited on the numbers recited in the present embodiment. In other embodiment, the numbers of the superlattice stacked layers can be two or more than two and the corresponding depths of the field-effect transistor can be different depending on the numbers of the superlattice stacked layers. In the present embodiment, the semiconductor device 500 is provided with one field-effect transistor, but the present disclosure is not limited on the numbers recited in the present embodiment. In other embodiment, the numbers of the field-effect transistors can be two or more than two. The arrangement of the superlattice stacked layers and the field-effect transistor are provided with reference to the above embodiments and drawings for details.

Figure 6A:
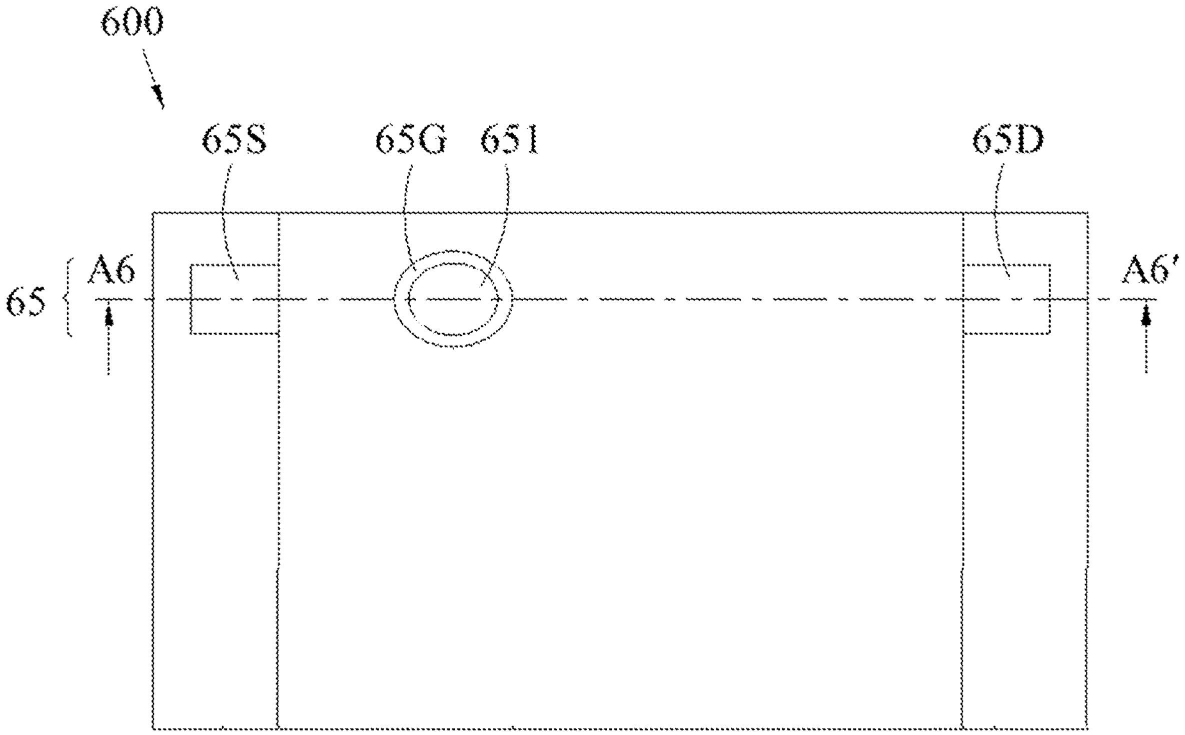
FIGS. 6A-6B are schematic diagrams of the semiconductor device in accordance with the sixth embodiment of the present disclosure.
Figure 6B:
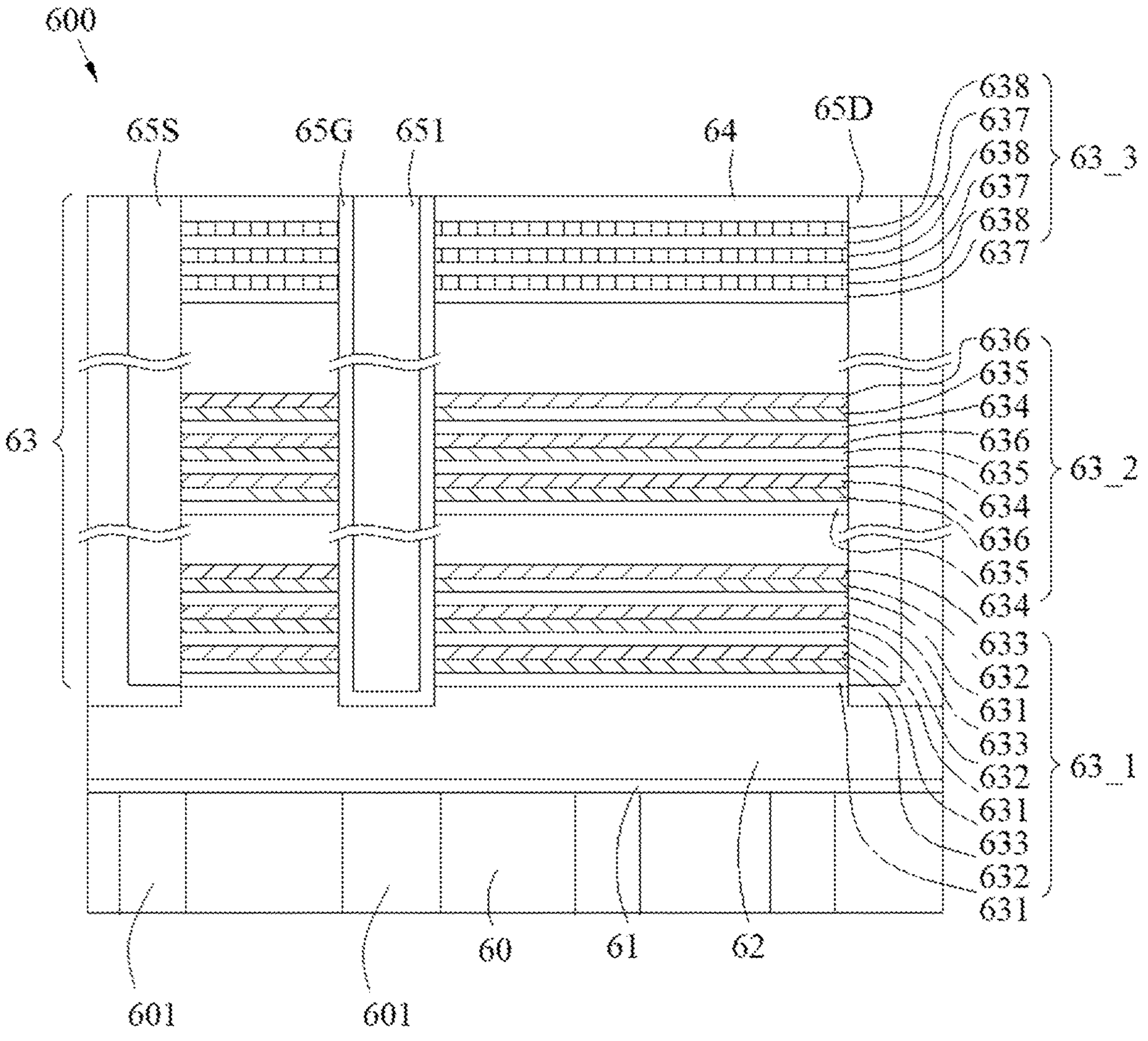

Please refer to FIGS. 6A-6B which are schematic diagrams of the semiconductor device in accordance with the sixth embodiment of the present disclosure. FIG. 6A shows the plan view of a semiconductor device 600. FIG. 6B shows the section view of a semiconductor device 600 along the dash line A6-A6' of the FIG. 6A.

The semiconductor device 600 includes a thermal conductive transferred-substrate 60, a metallic interlayer 61, a cap layer 62, a superlattice stack 63, a buffer layer 64, and a first field-effect transistor 65.

The thermal conductive transferred-substrate 60 is a semiconductor wafer embedded with a plurality of via-holes in which each is filled with a thermal conductive material 601. The via-holes and the thermal conductive material 601 can be aligned with the gate 65G of the field-effect transistor 65 thereby dissipating the heat generated from the active region. A projected area of one of the thermal conductive material 601 can be equal to or less than a projected area of the gate 65G. A thermal conductivity of the thermal conductive material 601 ranges between 50 to 5000 $W \cdot K^{-1} \cdot m^{-2}$, preferably 400-1000 $W \cdot K^{-1} \cdot m^{-2}$.

Examples of the thermal conductive transferred-substrate 60 includes SiC, Si, GaN or $Al_2O_3$. Examples of the thermal conductive material 601 includes iron, platinum, aluminum, gold, silver, or alloy thereof, or graphene.

The metallic interlayer 61 is disposed on the thermal conductive transferred-substrate 60 and is used for adhering the thermal conductive transferred-substrate 60 to the cap layer 62. A material of the metallic interlayer includes GaN material. The buffer layer is disposed on the metallic interlayer. A material of the cap layer 62 includes AuTi alloy, AuSn alloy, or AuNi alloy. Therefore, the superlattice stack 63 can be formed on a native sapphire substrate and then the native sapphire substrate is removed from the superlattice stack 63 by a laser lift-off process known in the art. The superlattice stack 63 can be transferred to the thermal conductive transferred-substrate 60 and the native sapphire substrate can be recycled and reused to generate another superlattice stack 63, thereby decreasing the manufacture cost.

The superlattice stack 63 is disposed on the cap layer 62. The buffer layer 64 is disposed on the superlattice stack 63. A material of the buffer layer 64 includes GaN material.

The superlattice stack 63 is formed by a multi-channel carrier transport superlattice stack (or heterojunction superlattice layers). The superlattice stack 63 includes a first set of superlattice stacked layers 63_1, a second set of superlattice stacked layers 63_3, a third set of superlattice stacked layers 63_2. The first set of superlattice stacked layers 63_1 is disposed on the buffer layer 62. The third set of superlattice stacked layers 63_2 is disposed on the first set of superlattice stacked layers 63_1. The second set of superlattice stacked layers 63_3 is disposed on the third set of superlattice stacked layers 63_2. Therefore, the third set of superlattice stacked layers 63_2 is disposed between the first set of superlattice stacked layers 63_1 and the second set of superlattice stacked layers 63_3.

The first set of superlattice stacked layers 63_1 consists of a plurality of $GaN/AlN/Al_{xi}Ga_{(1-xi)}N$ superlattice layer-pairs groups. Each of the $GaN/AlN/Al_{xi}Ga_{(1-xi)}N$ superlattice layer-pairs groups sequentially consists of a GaN channel layer 631, AlN spacer layer 632, and an $Al_{xi}Ga_{(1-xi)}N$ barrier layer 633. A thickness of one AlN spacer layer 632 ranges from 0.5 nm to 1 nm and a thickness of each layer of the $Al_{xi}Ga_{(1-xi)}N/GaN$ superlattice layer-pairs group ranges from 20 nm to 80 nm, preferably 20 nm to 40 nm. Therefore, a thickness of the overall device can be manufactured thinner and is less than 100 μm, preferably less than 80 μm, preferably ranges from 200 nm to 80 μm. Therefore, a thickness of one $GaN/AlN/Al_{xi}Ga_{(1-xi)}N$ superlattice layer-pairs group ranges from 20.5 nm to 81 nm, preferably 20.5 nm to 41 nm. In the $Al_{xi}Ga_{(1-xi)}N$ barrier layer 633, i is an integer representing $i^{th}$ layer, and xi is a mole fraction ranging from $0.1 \le xi < 1$, preferably $0.3 \le xi < 1$. The mole fraction xi, x, or i is decreasing from the thermal conductive transferred-substrate 60 such that the Al element of $Al_{xi}Ga_{(1-xi)}N$ barrier layer 633 closest to the cap layer has the greatest mole fraction xi. For example, when x is equal to 0.3 and i is equal to 1 to 3, The first set of superlattice stacked layers 63_1 consists of a $GaN/AlN/Al_{0.31}Ga_{(1-0.31)}N$ superlattice layer-pairs group, a $GaN/AlN/Al_{0.32}Ga_{(1-0.32)}N$ superlattice layer-pairs group, and a $GaN/AlN/Al_{0.33}Ga_{(1-0.33)}N$ superlattice layer-pairs group. Therefore, the first set of superlattice stacked layers 63_1 forms a two-dimensional electron gas (2DEG) carrier transport to generate a first current channel group.

The third set of superlattice stacked layers 63_2 consists of a plurality of $GaN/AlN/Al_{yj}Ga_{(1-yj)}N$ superlattice layer-pairs groups. Each of the $GaN/AlN/Al_{yj}Ga_{(1-yj)}N$ superlattice layer-pairs groups sequentially consists of a GaN channel layer 634, AlN spacer layer 635, and an $Al_{yj}Ga_{(1-yj)}N$ barrier layer 636. A thickness of one AlN spacer layer 635 ranges from 0.5 nm to 1 nm and a thickness of each layer of the $Al_{yj}Ga_{(1-yj)}N/GaN$ superlattice layer-pairs group ranges from 20 nm to 80 nm, preferably 20 nm to 40 nm. Therefore, a thickness of the overall device can be manufactured thinner and is less than 150 μm. Therefore, a thickness of one $GaN/AlN/Al_{yj}Ga_{(1-yj)}N$ superlattice layer-pairs group ranges from 20.5 nm to 81 nm, preferably 20.5 nm to 41 nm. In the $Al_{yj}Ga_{(1-yj)}N$ barrier layer 636, j is an integer representing $j^{th}$ layer, and yj is a mole fraction ranging from $0.1 \le yj < 1$, preferably $0.3 \le yj < 1$. The mole fraction yj, y, or j is decreasing from the thermal conductive transferred-substrate 60 such that the Al element of $Al_{yj}Ga_{(1-yj)}N$ barrier layer 636 closest to the cap layer has the greatest mole fraction yj. For example, when y is equal to 0.3 and j is equal to 1 to 3, The third set of superlattice stacked layers 63_2 consists of a $GaN/AlN/Al_{0.31}Ga_{(1-0.31)}N$ superlattice layer-pairs group, a $GaN/AlN/Al_{0.32}Ga_{(1-0.32)}N$ superlattice layer-pairs group, and a $GaN/AlN/Al_{0.33}Ga_{(1-0.33)}N$ superlattice layer-pairs group. Therefore, the third set of superlattice stacked layers 63_2 forms a two-dimensional electron gas (2DEG) carrier transport to generate a second current channel group.

The second set of superlattice stacked layers 63_3 consists of a plurality of $In_{zk}Ga_{(1-zk)}N/GaN$ superlattice layer-pairs groups. Each of the $In_{zk}Ga_{(1-zk)}N/GaN$ superlattice layer-pairs groups sequentially consists of an $In_{zk}Ga_{(1-zk)}N$ barrier layer 637 and a GaN channel layer 638. A thickness of each layer of the $In_{zk}Ga_{(1-zk)}N/GaN$ superlattice layer-pairs group ranges from 20 nm to 80 nm, preferably 20 nm to 40 nm. Therefore, a thickness of the overall device can be manufactured thinner and is less than 150 μm. In the $In_{zk}Ga_{(1-zk)}N$ barrier layer 637, k is an integer representing $k^{th}$ layer, and zk is a mole fraction ranging from $0.1 \leq zk < 1$, preferably $0.3 \leq zk < 1$. The mole fraction zk, z, or k is decreasing from the thermal conductive substrate 10 such that the In element of $In_{zk}Ga_{(1-zk)}N$ barrier layer 637 closest to the cap layer has the greatest mole fraction zk. For example, when z is equal to 0.3 and k is equal to 1 to 10, The second set of superlattice stacked layers 63_3 consists of an $In_{0.31}Ga_{(1-0.31)}N/GaN$ superlattice layer-pairs group, an $In_{0.32}Ga_{(1-0.32)}N/GaN$ superlattice layer-pairs group, and an $In_{0.33}Ga_{(1-0.33)}N/GaN$ superlattice layer-pairs group, and so on. The second set of superlattice stacked layers 63_3 forms a two-dimensional hole gas (2DHG) carrier transport at different depths to generate a third current channel group. The different carrier flow transport means form the multi-channel semiconductor layers.

The AlN spacer layers 632, 635 can increase the carrier mobility, so as to provide a high-speed semiconductor device. In addition, each of the AlN spacer layers 632, 635 is a thin layer for reducing the thickness of the semiconductor device 600.

In the present embodiment, the first set of superlattice stacked layers 63_1 only show three $GaN/AlN/Al_{xi}Ga_{(1-xi)}N$, the second set of superlattice stacked layers 63_3 only show three $In_{zk}Ga_{(1-zk)}N/GaN$ superlattice layer-pairs groups, and the third set of superlattice stacked layers 63_2 only show three $GaN/AlN/Al_{yj}Ga_{(1-yj)}N$ superlattice layer-pairs groups. However, the number of the superlattice layer-pairs groups is not limited herein and may be up to 100 pairs. The pair numbers are adjusted according to the power demand or the device thickness of the semiconductor device 600. For example, the device thickness of the semiconductor device 600 may be less than 20 μm. In the thickness range, the pair numbers of each superlattice layer-pairs groups may be 10~100.

The first field-effect transistor 65 is electrically connected to the superlattice stack 63. The first field-effect transistor 65 includes a first source 65S, a first drain 65D, and a first gate 65G. The first source 65S is disposed on a side of the thermal conductive transferred-substrate 60 and penetrates into superlattice stack 63, while the first drain 65D is disposed on another side of the thermal conductive transferred-substrate 60 and penetrates into superlattice stack 63. The first gate 65G is positioned between the first source 65S and the first drain 65D. The first gate 65G is disposed within a contact via passing through the buffer layer 64 and the entirety of the superlattice stack 63. That is, a first depth of the first gate 65G is less than or equal to a depth of the first set of superlattice stacked layers 63_1, the second set of superlattice stacked layers 63_3, and the third set of superlattice stacked layers 63_2. Therefore, the electric field generated by the first source 65S, the first drain 65D and the first gate 65G controls the first current channel group, the second current channel group, and the third current channel group. An insulating material 651 is filled or concentrically formed in the first gate 65G. An example of the insulating material 652 includes poly-silicon (poly-Si). The first gate 65G is shaped as at least one of a circle, a semi-circle, a rectangle, a polygon, or an octagon. The insulating material 651 is disposed along a longitudinal axis of the first gate 65G.

In the present embodiment, the semiconductor device 600 is provided with three superlattice stacked layers, but the present disclosure is not limited on the numbers recited in the present embodiment. In other embodiment, the numbers of the superlattice stacked layers can be two or more than two and the corresponding depths of the field-effect transistor can be different depending on the numbers of the superlattice stacked layers. In the present embodiment, the semiconductor device 600 is provided with one field-effect transistor, but the present disclosure is not limited on the numbers recited in the present embodiment. In other embodiment, the numbers of the field-effect transistors can be two or more than two. The arrangement of the superlattice stacked layers and the field-effect transistor are provided with reference to the above embodiments and drawings for details.

Figure 7A:
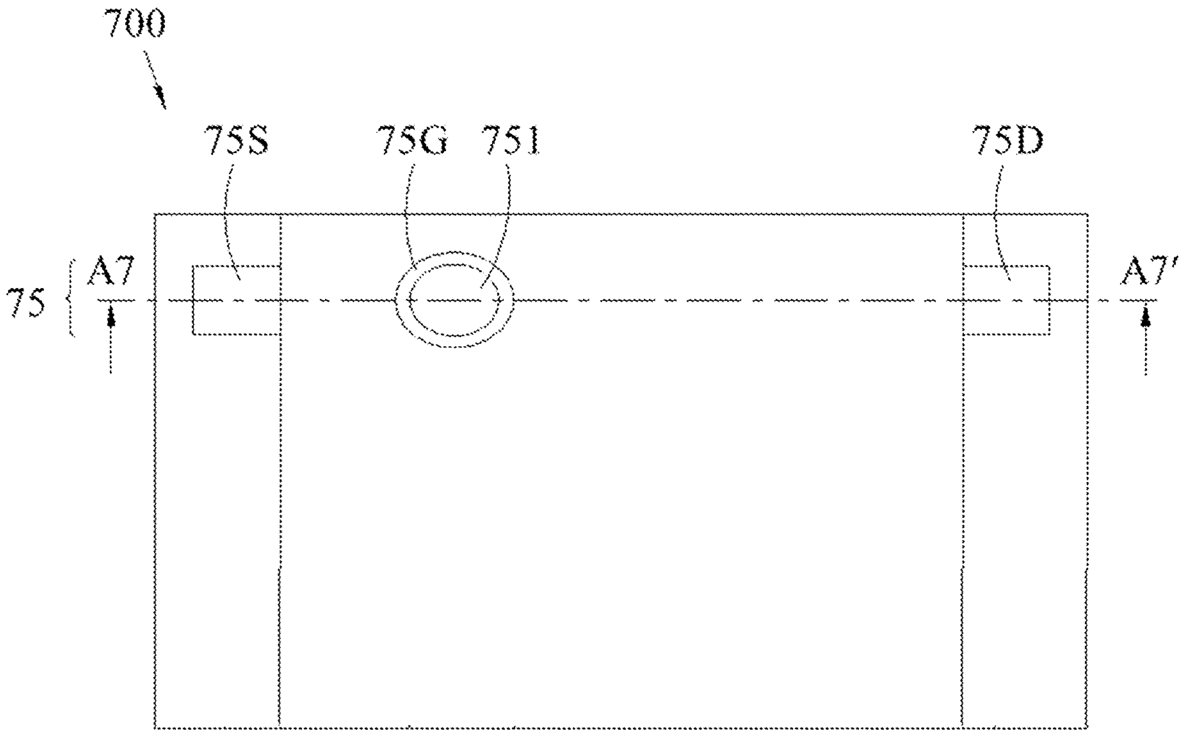
FIGS. 7A-7B are schematic diagrams of the semiconductor device in accordance with the seventh embodiment of the present disclosure.
Figure 7B:
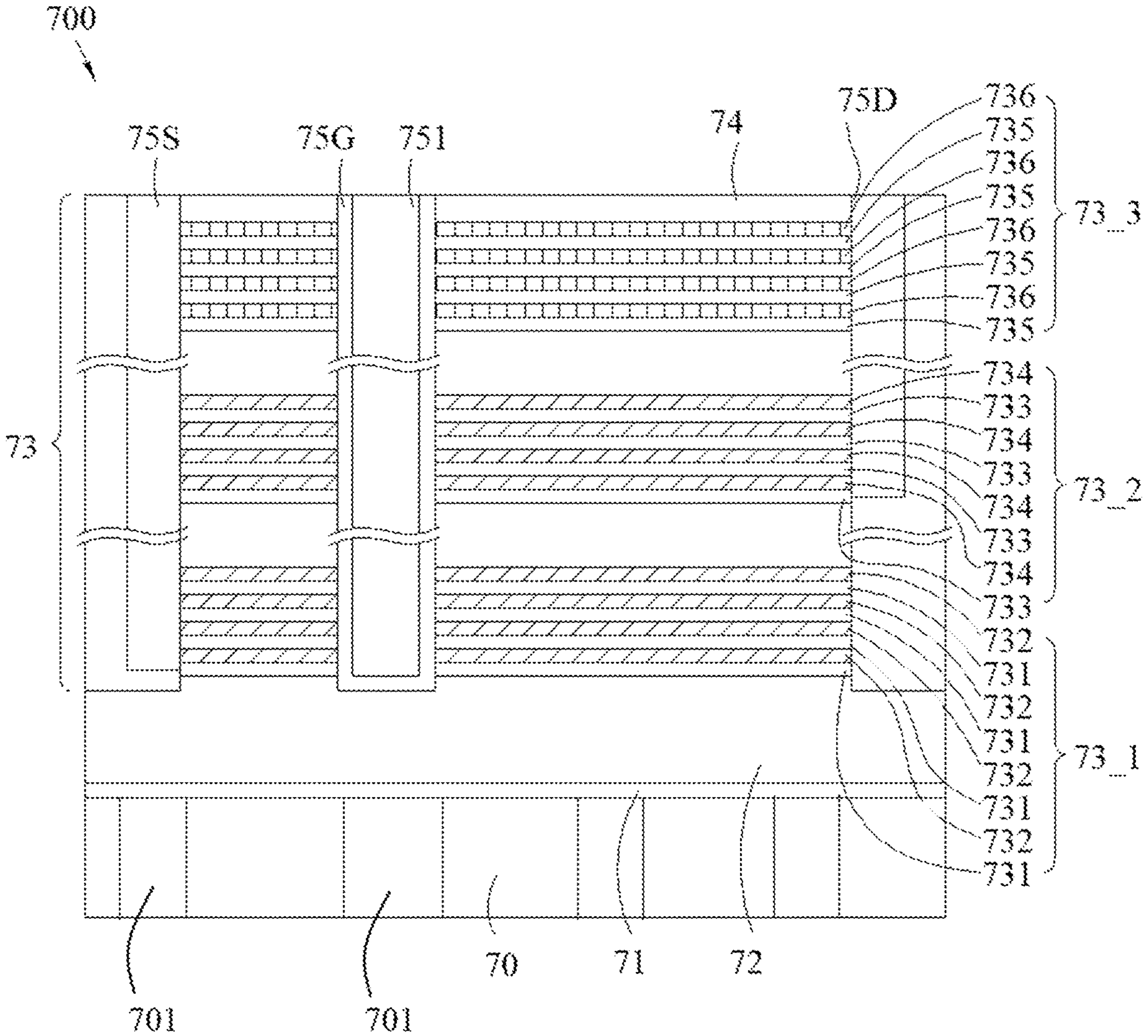

Please refer to FIGS. 7A-7B which are schematic diagrams of the semiconductor device in accordance with the seventh embodiment of the present disclosure. FIG. 7A shows the plan view of a semiconductor device 700. FIG. 7B shows the section view of a semiconductor device 700 along the dash line A7-A7' of the FIG. 7A.

The semiconductor device 700 includes a thermal conductive transferred-substrate 70, a metallic interlayer 71, a cap layer 72, a superlattice stack 73, a buffer layer 74, and a first field-effect transistor 75.

The thermal conductive transferred-substrate 70 is a semiconductor wafer embedded with a plurality of via-holes in which each is filled with a thermal conductive material 701. The via-holes and the thermal conductive material 701 can be aligned with the gate 75G of the field-effect transistor 65 thereby dissipating the heat generated from the active region. A projected area of one of the thermal conductive material 701 can be equal to or less than a projected area of the gate 75G. A thermal conductivity of the thermal conductive material 701 ranges between 50 to 5000 $W \cdot K^{-1} \cdot m^{-2}$, preferably 400-1000 $W \cdot K^{-1} \cdot m^{-2}$.

Examples of the thermal conductive transferred-substrate 70 includes SiC, Si, GaAs or $Al_2O_3$. Examples of the thermal conductive material 701 includes iron, platinum, aluminum, gold, silver, or alloy thereof, or graphene.

The metallic interlayer 71 is disposed on the thermal conductive transferred-substrate 70 and is used for adhering the thermal conductive transferred-substrate 70 to the cap layer 72. A material of the metallic interlayer includes GaAs material. The buffer layer is disposed on the metallic interlayer. A material of the cap layer 72 includes AuTi alloy, AuSn alloy, or AuNi alloy. Therefore, the superlattice stack 73 can be formed on a native sapphire substrate and then the native sapphire substrate is removed from the superlattice stack 63 by a laser lift-off process known in the art. The superlattice stack 73 can be transferred to the thermal conductive transferred-substrate 70 and the native sapphire substrate can be recycled and reused to generate another superlattice stack 73, thereby decreasing the manufacture cost.

The superlattice stack 73 is disposed on the cap layer 72. The buffer layer 74 is disposed on the superlattice stack 73. A material of the buffer layer 74 includes GaAs material.

The superlattice stack 73 is formed by a multi-channel carrier transport superlattice stack (or heterojunction superlattice layers). The superlattice stack 73 includes a first set of superlattice stacked layers 73_1, a second set of superlattice stacked layers 73_3, a third set of superlattice stacked layers 73_2. The first set of superlattice stacked layers 73_1 is disposed on the buffer layer 72. The third set of superlattice stacked layers 73_2 is disposed on the first set of superlattice stacked layers 73_1. The second set of superlattice stacked layers 73_3 is disposed on the third set of superlattice stacked layers 73_2. Therefore, the third set of superlattice stacked layers 73_2 is disposed between the first set of superlattice stacked layers 73_1 and the second set of superlattice stacked layers 73_3.

The first set of superlattice stacked layers 73_1 consists of a plurality of $Al_{xi}Ga_{(1-xi)}As/GaAs$ superlattice layer-pairs groups. Each of the $Al_{xi}Ga_{(1-xi)}As/GaAs$ superlattice layer-pairs groups consists of an $Al_{xi}Ga_{(1-xi)}As$ barrier layer 731 and an GaAs channel layer 732. A thickness of each layer of the $Al_{xi}Ga_{(1-xi)}As/GaAs$ superlattice layer-pairs groups ranges from 20 nm to 80 nm, preferably 20 nm to 40 nm. Therefore, a thickness of the overall device can be manufactured thinner and is less than 150 μm. In the $Al_{xi}Ga_{(1-xi)}As$ barrier layer 731, i is an integer representing $i^{th}$ layer, and xi is a mole fraction ranging from 0.1≤xi<1, preferably 0.3≤xi<1. The mole fraction xi, x, or i is decreasing from the thermal conductive substrate 10 such that the Al element of $Al_{xi}Ga$ (1-xi) As barrier layer 731 closest to the cap layer 34 has the greatest mole fraction xi. For example, when x is equal to 0.3 and i is equal to 1 to 3, The first set of superlattice stacked layers 73_1 consists of an $Al_{0.31}Ga_{(1-0.31)}N/GaAs$ superlattice layer-pairs group, an $Al_{0.32}Ga_{(1-0.32)}As/GaAs$ superlattice layer-pairs group, and an $Al_{0.33}Ga_{(1-0.33)}As/GaAs$ superlattice layer-pairs group. Therefore, the first set of superlattice stacked layers 73_1 forms a two-dimensional electron gas (2DEG) carrier transport to generate a first current channel group.

The second set of superlattice stacked layers 73_3 consists of a plurality of $Al_{zk}Ga_{(1-zk)}As/GaAs$ superlattice layer-pairs groups. Each of the $Al_{zk}Ga_{(1-zk)}As/GaAs$ superlattice layer-pairs groups consists of an $Al_{zk}Ga_{(1-zk)}As$ barrier layer 735 and an GaAs channel layer 736. A thickness of each layer of the $Al_{zk}Ga_{(1-zk)}As/GaAs$ superlattice layer-pairs groups ranges from 20 nm to 80 nm, preferably 20 nm to 40 nm. Therefore, a thickness of the overall device can be manufactured thinner and is less than 150 μm. In the $Al_{zk}Ga_{(1-zk)}As$ barrier layer 735, k is an integer representing $k^{th}$ layer, and zk is a mole fraction ranging from 0.1≤zk<1, preferably 0.3≤zk<1. The mole fraction zk, z, or k is decreasing from the thermal conductive substrate 10 such that the Al element of $Al_{zk}Ga_{(1-zk)}As$ barrier layer 735 closest to the cap layer 74 has the greatest mole fraction zk. For example, when z is equal to 0.3 and k is equal to 1 to 10, The second set of superlattice stacked layers 73_3 consists of an $Al_{0.31}Ga_{(1-0.31)}As/GaAs$ superlattice layer-pairs group, an $In_{0.32}Ga_{(1-0.32)}N/GaAs$ superlattice layer-pairs group, and an $Al_{0.33}Ga_{(1-0.33)}N/GaAs$ superlattice layer-pairs group, and so on. The second set of superlattice stacked layers 73_3 forms a two-dimensional hole gas (2DHG) carrier transport at different depths to generate a second current channel group. The different carrier flow transport means form the multi-channel semiconductor layers.

The third set of superlattice stacked layers 73_2 consists of a plurality of $Al_{yj}Ga_{(1-yj)}As/GaAs$ superlattice layer-pairs groups. Each of the $Al_{yj}Ga_{(1-yj)}N/GaAs$ superlattice layer-pairs groups consists of an $Al_{yj}Ga_{(1-yj)}As$ barrier layer 733 and an GaAs channel layer 734. A thickness of each layer of the $Al_{yj}Ga_{(1-yj)}As/GaAs$ superlattice layer-pairs groups ranges from 20 nm to 80 nm, preferably 20 nm to 40 nm. Therefore, a thickness of the overall device can be manufactured thinner and is less than 150 μm. In the $Al_{yj}Ga_{(1-yj)}As$ barrier layer 733, $j^{th}$ is an integer representing $i^{th}$ layer, and yj is a mole fraction ranging from 0.1≤yj<1, preferably 0.3≤yj<1. The mole fraction yj, y, or j is decreasing from the thermal conductive substrate 10 such that the Al element of $Al_{yj}Ga_{(1-yj)}As$ barrier layer 733 closest to the cap layer 74 has the greatest mole fraction yj. For example, when y is equal to 0.3 and j is equal to 1 to 3. The third set of superlattice stacked layers 73_2 consists of an $Al_{0.31}Ga_{(1-0.31)}As/GaAs$ superlattice layer-pairs group, an $Al_{0.32}Ga_{(1-0.32)}N/GaAs$ superlattice layer-pairs group, and an $Al_{0.33}Ga_{(1-0.33)}As/GaAs$ superlattice layer-pairs group. Therefore, the third set of superlattice stacked layers 73_2 forms a two-dimensional electron gas (2DEG) carrier transport to generate a third current channel group.

In the present embodiment, the first set of superlattice stacked layers 73_1 only show four $Al_{xi}Ga_{(1-xi)}As/GaAs$ superlattice layer-pairs groups, the second set of superlattice stacked layers 73_3 only show four $Al_{zk}Ga_{(1-zk)}As/GaAs$ superlattice layer-pairs groups, and the third set of superlattice stacked layers 73_2 only show four $Al_{yj}Ga_{(1-yj)}N/GaAs$ superlattice layer-pairs groups. However, the number of the $Al_{xi}Ga_{(1-xi)}N/GaAs$ superlattice layer-pairs groups and the $Al_{yj}Ga_{(1-yj)}As/GaAs$ superlattice layer-pairs groups is not limited herein and may up to 100 pairs. The pair numbers are adjusted according to the power demand or the device thickness of the semiconductor device 700. For example, the device thickness of the semiconductor device 700 may be less than 20 μm. In the thickness range, the pair numbers of each superlattice layer-pairs groups may be 10~100.

The first field-effect transistor 75 is electrically connected to the superlattice stack 73. The first field-effect transistor 75 includes a first source 75S, a first drain 75D, and a first gate 75G. The first source 75S is disposed on a side of the thermal conductive transferred-substrate 70 and penetrates into superlattice stack 73, while the first drain 75D is disposed on another side of the thermal conductive transferred-substrate 70 and penetrates into superlattice stack 73. The first gate 75G is positioned between the first source 75S and the first drain 75D. The first gate 75G is disposed within a contact via passing through the buffer layer 74 and the entirety of the superlattice stack 73. That is, a first depth of the first gate 75G is less than or equal to a depth of the first set of superlattice stacked layers 73_1, the second set of superlattice stacked layers 73_3, and the third set of superlattice stacked layers 73_2. Therefore, the electric field generated by the first source 75S, the first drain 75D and the first gate 75G controls the first current channel group, the second current channel group, and the third current channel group. An insulating material 751 is filled or concentrically formed in the first gate 75G. An example of the insulating material 752 includes poly-silicon (poly-Si). The first gate 75G is shaped as at least one of a circle, a semi-circle, a rectangle, a polygon, or an octagon. The insulating material 751 is disposed along a longitudinal axis of the first gate 75G.

In the present embodiment, the semiconductor device 700 is provided with three superlattice stacked layers, but the present disclosure is not limited on the numbers recited in the present embodiment. In other embodiment, the numbers of the superlattice stacked layers can be two or more than two and the corresponding depths of the field-effect transistor can be different depending on the numbers of the superlattice stacked layers. In the present embodiment, the semiconductor device 700 is provided with one field-effect transistor, but the present disclosure is not limited on the numbers recited in the present embodiment. In other embodiment, the numbers of the field-effect transistors can be two or more than two. The arrangement of the superlattice stacked layers and the field-effect transistor are provided with reference to the above embodiments and drawings for details.

In the present embodiment, the semiconductor device 700 is provided with three superlattice stacked layers, but the present disclosure is not limited on the numbers recited in the present embodiment. In other embodiment, the numbers of the superlattice stacked layers can be two or more than two and the corresponding depths of the field-effect transistor can be different depending on the numbers of the superlattice stacked layers. In the present embodiment, the semiconductor device 700 is provided with one field-effect transistor, but the present disclosure is not limited on the numbers recited in the present embodiment. In other embodiment, the numbers of the field-effect transistors can be two or more than two. The arrangement of the superlattice stacked layers and the field-effect transistor are provided with reference to the above embodiments and drawings for details.

The present disclosure disclosed herein has been described by means of specific embodiments. However, numerous modifications, variations and enhancements can be made thereto without departing from the spirit and scope of the disclosure set forth in the claims.

What is claimed is:

1. A semiconductor device, comprising:

a thermal conductive substrate, wherein the thermal conductive substrate that is a semiconductor wafer embedded with a plurality of via-holes filled with a thermal conductive material;

a nucleation layer disposed on the thermal conductive substrate;

a buffer layer disposed on the nucleation layer;

a superlattice stack disposed on the buffer layer, wherein the superlattice stack comprises a first set of superlattice stacked layers and a second set of superlattice stacked layers disposed on the first set of superlattice stacked layers, with the first set of superlattice stacked layers comprising a material different from the second set of superlattice stacked layers, the first set of superlattice stacked layers configured to form a two-dimensional electron gas (2DEG) carrier transport to generate a first current channel group and the second set of superlattice stacked layers configured to form a two dimensional hole gas (2DHG) carrier transport to generate a second current channel group;

a cap layer disposed on the superlattice stack;

a field-effect transistor comprising a gate disposed within a contact via passing through the cap layer until contacting the second set of superlattice stacked layers to control both the first current channel group and the second current channel group;

wherein one of the via-holes is aligned with the gate of the field-effect transistor, and a projected area of the thermal conductive material of the one of the via-holes aligned with the gate is equal to or less than a projected area of the gate, wherein the first set of superlattice stacked layers comprise a plurality of $Al_{xi}Ga_{(1-xi)}N/GaN$ superlattice layer-pairs groups, in which i is an integer representing $i^{th}$ layer and xi is a mole fraction ranging from $0.1 \le xi < 1$, wherein the second set of superlattice stacked layers comprise a plurality of $In_{zk}Ga_{(1-zk)}N/GaN$ superlattice layer-pairs groups, in which k is an integer representing $k^{th}$ layer and zk is a mole fraction ranging from $0.1 \le zk < 1$.

2. The semiconductor device of claim 1, wherein the metallic material filling in the embedded via-holes of thermal conductive native-substrate is AuTi alloy, AuSn alloy or AuNi alloy.

3. The semiconductor device of claim 1, wherein the semiconductor wafer of the native-substrate is SiC, Si, GaN, or $Al_2O_3$.

4. The semiconductor device of claim 1, wherein the superlattice stack further comprises a AlN spacer layer.

5. The semiconductor device of claim 1, wherein xi is a mole fraction ranging from $0.3 \le xi < 1$.

6. The semiconductor device of claim 5, wherein zk is a mole fraction ranging from $0.33 \le zk < 1$.

7. The semiconductor device of claim 6, wherein the superlattice stack further comprises a third set of superlattice stacked layers disposed between the first set of superlattice stacked layers and the second set of superlattice stacked layers to form a two dimensional hole gas (2DHG) carrier transport to generate a third current channel group.

8. The semiconductor device of claim 7, wherein the third set of superlattice stacked layers comprises a plurality of $Al_{yj}Ga_{(1-yj)}N/GaN$ superlattice layer-pairs groups, in which j is an integer representing $j^{th}$ layer and yj is a mole fraction ranging from $0.33 \le yj < 1$.

9. The semiconductor device of claim 8, wherein xi is larger than yj.

10. The semiconductor device of claim 7, wherein the gate further passes through the third set of superlattice stacked layers and controls the third current channel group.

11. A semiconductor device, comprising:

a thermal conductive transferred-substrate, wherein the thermal conductive transferred-substrate that is a semiconductor wafer embedded with a plurality of via-holes filled with a thermal conductive material;

a metallic interlayer disposed on the thermal conductive transferred-substrate and is configured to adhere the thermal conductive transferred-substrate;

a cap layer disposed on the metallic interlayer;

a superlattice stack disposed on the cap layer, wherein the superlattice stack comprises a first set of superlattice stacked layers and a second set of superlattice stacked layers disposed on the first set of superlattice stacked layers, with the first set of superlattice stacked layers comprising a material different from the second set of superlattice stacked layers, the first set of superlattice stacked layers configured to form a two-dimensional electron gas (2DEG) carrier transport to generate a first current channel group and the second set of superlattice stacked layers configured to form a two dimensional hole gas (2DHG) carrier transport to generate a second current channel group;

a buffer layer disposed on the superlattice stack;

a field-effect transistor comprising a gate disposed within a contact via passing through the buffer layer until contacting the second set of superlattice stacked layers to control both the first current channel group and the second current channel group;

wherein one of the via-holes is aligned with the gate of the field-effect transistor, and a projected area of the thermal conductive material of the one of the via-holes aligned with the gate is equal to or less than a projected area of the gate, wherein the first set of superlattice stacked layers comprise a plurality of $Al_{xi}Ga_{(1-xi)}N/GaN$ superlattice layer-pairs groups, in which i is an integer representing $i^{th}$ layer and xi is a mole fraction ranging from 0.1≤xi<1, wherein the second set of superlattice stacked layers comprise a plurality of $In_{zk}Ga_{(1-zk)}N/GaN$ superlattice layer-pairs groups, in which k is an integer representing $k^{th}$ layer and zk is a mole fraction ranging from 0.1≤zk<1.

12. The semiconductor device of claim 11, wherein the metallic material filling in the embedded via-holes of thermal conductive native-substrate is AuTi alloy, AuSn alloy or AuNi alloy.

13. The semiconductor device of claim 11, wherein the semiconductor wafer of the native-substrate is SiC, Si, GaAs, GaP, or GaN.

14. The semiconductor device of claim 11, wherein the metallic interlayer is AuTi alloy, AuSn alloy, or AuNi alloy.

15. The semiconductor device of claim 11, wherein xi is a mole fraction ranging from 0.3≤xi<1.

16. The semiconductor device of claim 15, wherein zk is a mole fraction ranging from 0.3≤zk<1.

17. The semiconductor device of claim 16, wherein the superlattice stack further comprises a third set of superlattice stacked layers disposed between the first set of superlattice stacked layers and the second set of superlattice stacked layers to form a two dimensional hole gas (2DHG) carrier transport to generate a third current channel group.

18. The semiconductor device of claim 17, wherein the third set of superlattice stacked layers comprises a plurality of $Al_{yj}Ga_{(1-yj)}N/GaN$ superlattice layer-pairs groups, in which j is an integer representing $j^{th}$ layer and yj is a mole fraction ranging from 0.33≤yj<1.

19. The semiconductor device of claim 18, wherein xi is larger than yj.

20. The semiconductor device of claim 17, wherein the gate further passes through the third set of superlattice stacked layers and controls the third current channel group.

* * * * *